United States Patent
Chang et al.

(10) Patent No.: US 11,881,274 B2
(45) Date of Patent: Jan. 23, 2024

(54) PROGRAM CONTROL CIRCUIT FOR ANTIFUSE-TYPE ONE TIME PROGRAMMING MEMORY CELL ARRAY

(71) Applicant: eMemory Technology Inc., Hsin-Chu (TW)

(72) Inventors: Chia-Fu Chang, Hsinchu County (TW); Po-Ping Wang, Hsinchu County (TW); Jen-Yu Peng, Hsinchu County (TW)

(73) Assignee: EMEMORY TECHNOLOGY INC., Hsin-Chu (TW)

( * ) Notice: Subject to any disclaimer, the term of this patent is extended or adjusted under 35 U.S.C. 154(b) by 105 days.

(21) Appl. No.: 17/842,835

(22) Filed: Jun. 17, 2022

(65) Prior Publication Data
US 2023/0154556 A1 May 18, 2023

Related U.S. Application Data

(60) Provisional application No. 63/279,184, filed on Nov. 15, 2021.

(51) Int. Cl.
*G11C 17/18* (2006.01)
*G11C 16/10* (2006.01)
*G11C 16/30* (2006.01)
*G11C 17/16* (2006.01)

(52) U.S. Cl.
CPC .......... *G11C 17/18* (2013.01); *G11C 16/102* (2013.01); *G11C 16/30* (2013.01); *G11C 17/16* (2013.01)

(58) Field of Classification Search
CPC ....... G11C 17/18; G11C 16/102; G11C 16/30; G11C 17/16
See application file for complete search history.

(56) References Cited

U.S. PATENT DOCUMENTS

| | | | | |
|---|---|---|---|---|
| 5,272,388 | A * | 12/1993 | Bakker | G11C 17/18 438/467 |
| 5,815,429 | A | 9/1998 | Sher et al. | |
| 9,646,692 | B1 * | 5/2017 | Lung | G11C 13/0064 |
| 10,475,510 | B2 * | 11/2019 | Yang | G11C 13/0026 |
| 2012/0243294 | A1 * | 9/2012 | Kaneko | G11C 13/0069 365/148 |
| 2015/0200161 | A1 * | 7/2015 | Wang | G11C 17/16 438/10 |
| 2016/0071589 | A1 * | 3/2016 | Thomas | G11C 13/0069 365/148 |

(Continued)

OTHER PUBLICATIONS

Xiaoyong Xue et al., "A 0.13 μm 8 Mb Logic-Based CuxSiyO ReRAM With Self-Adaptive Operation for Yield Enhancement and Power Reduction", May 2013, pp. 1315-1322, vol. 48, No. 5, IEEE Journal of Solid-State Circuits.

*Primary Examiner* — Jay W. Radke
(74) *Attorney, Agent, or Firm* — WPAT, P.C.

(57) ABSTRACT

A program control circuit for an antifuse-type one time programming memory cell array is provided. When the program action is performed, the program control circuit monitors the program current from the memory cell in real time and increases the program voltage at proper time. When the program control circuit judges that the program current generated by the memory cell is sufficient, the program control circuit confirms that the program action is completed.

18 Claims, 11 Drawing Sheets

(56) References Cited

U.S. PATENT DOCUMENTS

| | | | |
|---|---|---|---|
| 2016/0078963 A1* | 3/2016 | Lacouture | G11C 5/145 |
| | | | 365/96 |
| 2016/0276010 A1* | 9/2016 | Takaya | G11C 11/161 |
| 2017/0011798 A1* | 1/2017 | Lin | G11C 13/0069 |
| 2017/0092356 A1* | 3/2017 | Wu | G11C 29/4401 |
| 2017/0243660 A1* | 8/2017 | Kim | G11C 17/18 |
| 2017/0262171 A1* | 9/2017 | Cheon | G06F 3/061 |
| 2018/0358093 A1* | 12/2018 | Lesartre | G11C 13/004 |
| 2020/0105345 A1* | 4/2020 | Baek | G11C 7/04 |

\* cited by examiner

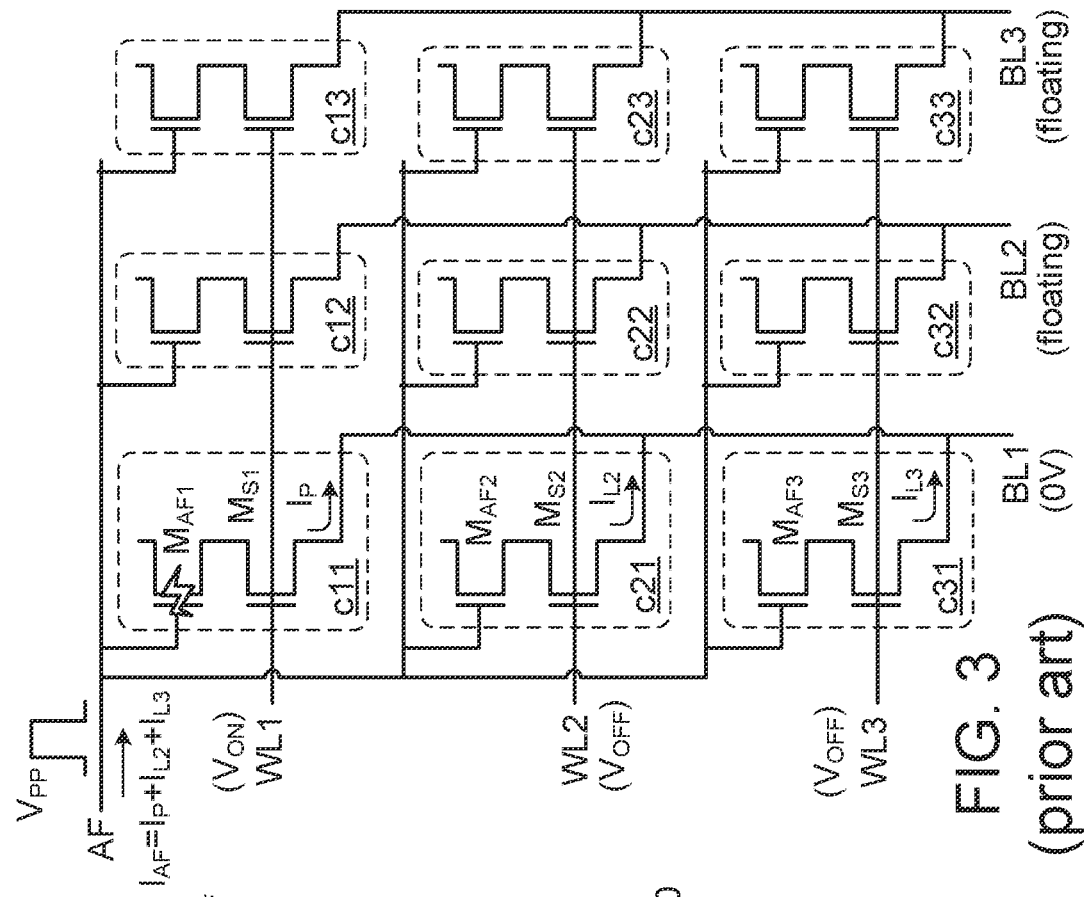
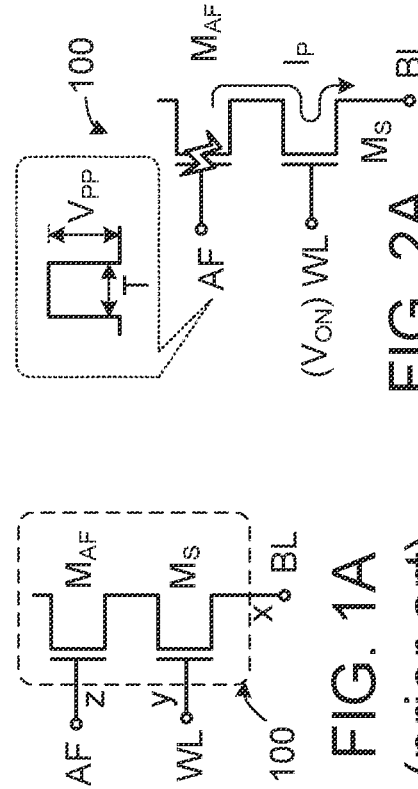
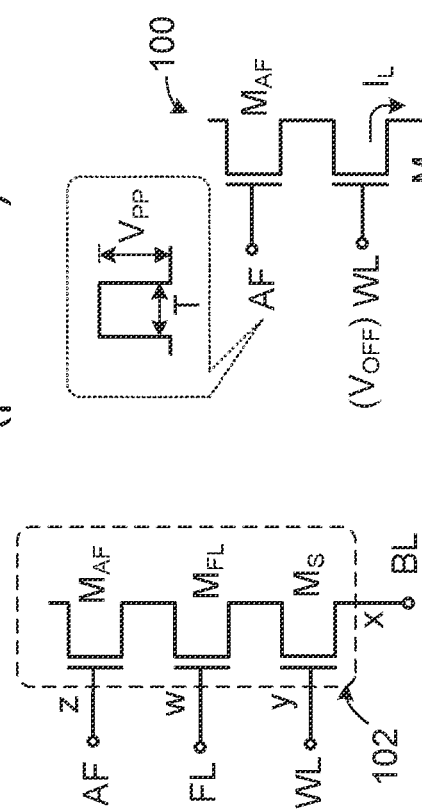
FIG. 1A (prior art)
FIG. 1B (prior art)
FIG. 2A (prior art)
FIG. 2B (prior art)
FIG. 3 (prior art)

PROGRAM CONTROL CIRCUIT FOR ANTIFUSE-TYPE ONE TIME PROGRAMMING MEMORY CELL ARRAY

This application claims the benefit of U.S. provisional application Ser. No. 63/279,184, filed Nov. 15, 2021, the subject matter of which is incorporated herein by reference.

FIELD OF THE INVENTION

The present invention relates to a control circuit for a memory cell, and more particularly to a program control circuit for an antifuse-type one time programming memory cell array.

BACKGROUND OF THE INVENTION

As is well known, the non-volatile memories may be classified into a multi-time programming memory (also referred as a MTP memory), a one time programming memory (also referred as an OTP memory) and a mask read only memory (also referred as a Mask ROM). Generally, the MTP memory can be programmed many times, and the stored data of the MTP memory can be modified many times. On the contrary, the OTP memory can be programmed once. After the OTP memory is programmed, the stored data fails to be modified. Moreover, after the Mask ROM leaves the factory, all stored data have been recorded therein. The user is only able to read the stored data from the Mask ROM, but is unable to program the Mask ROM.

For example, before the memory cell of an antifuse-type OTP memory is programmed, the memory cell of the antifuse-type OTP memory is in a high-resistance storage state. After the memory cell of an antifuse-type OTP memory is programmed, the memory cell of the antifuse-type OTP memory is in a low-resistance storage state. After the memory cell of an antifuse-type OTP memory is programmed, the stored data cannot be changed.

FIGS. 1A and 1B are schematic equivalent circuit diagrams illustrating two conventional antifuse-type OTP memory cells. For brevity, the antifuse-type OTP memory cell is referred hereinafter as the OTP memory cell.

As shown in FIG. 1A, the OTP memory cell 100 is a three-terminal device. The first terminal x of the OTP memory cell 100 is connected to a bit line BL. The second terminal y of the OTP memory cell 100 is connected to a word line WL. The third terminal z of the OTP memory cell 100 is connected to an antifuse control line AF. The OTP memory cell 100 comprises a select transistor $M_S$ and an antifuse transistor $M_{AF}$. The first drain/source terminal of the select transistor $M_S$ is connected to the bit line BL. The gate terminal of the select transistor $M_S$ is connected to the word line WL. The second drain/source terminal of the select transistor $M_S$ is connected to the first drain/source terminal of the antifuse transistor $M_{AF}$. The gate terminal of the antifuse transistor $M_{AF}$ is connected to the antifuse control line AF. The second drain/source terminal of the antifuse transistor $M_{AF}$ is in a floating state. Since the second drain/source terminal of the antifuse transistor $M_{AF}$ is in the floating state, the antifuse transistor $M_{AF}$ can be considered as a capacitor. Moreover, since the OTP memory cell 100 includes one transistor and one capacitor, the OTP memory cell 100 can be referred as a 1T1C cell.

As shown in FIG. 1B, the OTP memory cell 102 is a four-terminal device. The first terminal x of the OTP memory cell 102 is connected to a bit line BL. The second terminal y of the OTP memory cell 102 is connected to a word line WL. The third terminal z of the OTP memory cell 102 is connected to an antifuse control line AF. The fourth terminal w of the OTP memory cell 102 is connected to a following control line FL. As shown in FIG.1B, the OTP memory cell 102 comprises a select transistor $M_S$, a following transistor $M_{FL}$ and an antifuse transistor $M_{AF}$. The first drain/source terminal of the select transistor $M_S$ is connected to the bit line BL. The gate terminal of the select transistor $M_S$ is connected to the word line WL. The second drain/source terminal of the select transistor $M_S$ is connected to the first drain/source terminal of the following transistor $M_{FL}$. The gate terminal of the following transistor $M_{FL}$ is connected to a following control line FL. The second drain/source terminal of the following transistor $M_{FL}$ is connected to the first drain/source terminal of the antifuse transistor $M_{AF}$. The gate terminal of the antifuse transistor $M_{AF}$ is connected to the antifuse control line AF. The second drain/source terminal of the antifuse transistor $M_{AF}$ is in a floating state. Since the second drain/source terminal of the antifuse transistor $M_{AF}$ is in the floating state, the antifuse transistor $M_{AF}$ can be considered as a capacitor. Moreover, since the OTP memory cell 102 includes two transistors and one capacitor, the OTP memory cell 102 can be referred as a 2T1C cell.

The structure of the OTP memory cell is not restricted. For example, an antifuse transistor $M_{AF}$ and more transistors can be collaboratively formed as another OTP memory cell.

A program action and a program inhibition action performed on the OTP memory cell 100 as shown in FIG. 1A will be described as follows. FIG. 2A schematically illustrates associated bias voltages for performing a program action on the conventional OTP memory cell as shown in FIG. 1A. FIG. 2B schematically illustrates associated bias voltages for performing a program inhibition action on the conventional OTP memory cell as shown in FIG. 1A.

Please refer to FIG. 2A. When the program action is performed, the antifuse control line AF receives a program pulse, the bit line BL receives a ground voltage (0V), and the word line WL receives an on voltage $V_{ON}$. Consequently, the word line WL is activated. For example, a pulse height of the program pulse is equal to a program voltage $V_{PP}$, and a pulse width of the program pulse is T.

When the program action is performed, the select transistor $M_S$ is turned on, and the ground voltage (0V) of the bit line BL is transferred to the first drain/source terminal of the antifuse transistor $M_{AF}$. When the antifuse control line AF receives the program pulse, the voltage stress between the gate terminal and the first drain/source terminal of the antifuse transistor $M_{AF}$ is equal to the program voltage $V_{PP}$. Under this circumstance, a gate oxide layer of the antifuse transistor $M_{AF}$ is ruptured, and a program current $I_P$ is generated. Consequently, the region between the gate terminal and the first drain/source terminal of the antifuse transistor $M_{AF}$ has a low resistance value. That is, the OTP memory cell 100 is programmed to a low-resistance storage state.

Please refer to FIG. 2B. When the program inhibition action is performed, the antifuse control line AF receives the program pulse, the bit line BL receives the ground voltage (0V), and the word line WL receives an off voltage $V_{OFF}$. Consequently, the word line WL is inactivated.

When the program inhibition action is performed, the select transistor $M_S$ is turned off, and the ground voltage (0V) of the bit line BL cannot be transferred to the first drain/source terminal of the antifuse transistor $M_{AF}$. When the antifuse control line AF receives the program pulse, the voltage stress between the gate terminal and the first drain/ source terminal of the antifuse transistor $M_{AF}$ is very low. Under this circumstance, the gate oxide layer of the antifuse transistor $M_{AF}$ is not ruptured, and the region between the gate terminal and the first drain/source terminal of the antifuse transistor $M_{AF}$ is maintained in a high resistance value. That is, the OTP memory cell 100 is in a high-resistance storage state.

Please refer to FIG. 2B again. When the program inhibition action is performed, the antifuse control line AF receives the program pulse, and the bit line BL receives the ground voltage (0V). Although the word line WL is inactivated, the select transistor $M_S$ may generate a leakage current $I_L$ in response to the program voltage $V_{PP}$. For example, the leakage current $I_L$ includes a gate induced drain leakage (GIDL) current.

FIG. 3 is a schematic circuit diagram illustrating an OTP memory cell array and associated bias voltages while a program action is performed. The memory cell array comprises M×N OTP memory cells, wherein M and N are positive integers. For illustration, the memory cell array comprises 3×3 OTP memory cells c11~c33. Each of the OTP memory cells c11~c33 has the structure as shown in FIG. 1A. It is noted that the structure of the OTP memory cell is not restricted. For example, plural OTP memory cells of FIG. 1B may be collaboratively formed as a memory cell array.

In the first row of the memory cell array, the first terminals of the OTP memory cells c11~c13 are respectively connected to the corresponding bit lines BL1~BL3, the second terminals of the OTP memory cells c11~c13 are connected to a word line WL1, and the third terminals of the OTP memory cells c11~c13 are connected to an antifuse control line AF. In the second row of the memory cell array, the first terminals of the OTP memory cells c21~c23 are respectively connected to the corresponding bit lines BL1~BL3, the second terminals of the OTP memory cells c21~c23 are connected to a word line WL2, and the third terminals of the OTP memory cells c21~c23 are connected to the antifuse control line AF. In the third row of the memory cell array, the first terminals of the OTP memory cells c31~c33 are respectively connected to the corresponding bit lines BL1~BL3, the second terminals of the OTP memory cells c31~c33 are connected to a word line WL3, and the third terminals of the OTP memory cells c31~c33 are connected to the antifuse control line AF.

When any OTP memory cell of the memory cell array is subjected to the program action, the antifuse control line AF receives a program pulse, and the corresponding word line is activated. The other word lines are inactivated. In addition, the corresponding bit line receives the ground voltage (0V), and the other bit lines are in the floating state. When the program action is performed on the OTP memory cell c11 of the memory cell array, the antifuse control line AF receives a program pulse, the word line WL1 receives an on voltage $V_{ON}$, the other word lines WL2 and WL3 receive an off voltage $V_{OFF}$, the bit line BL1 receives a ground voltage (0V), and the other bit lines BL2 and BL3 are in a floating state. Consequently, the word line WL1 is activated, and the other word lines WL2 and WL3 are inactivated. The pulse height of the program pulse is equal to a program voltage $V_{PP}$, and a pulse width of the program pulse is T. For example, the pulse width T is 10 μs, the program voltage $V_{PP}$ is 6.5V, the on voltage $V_{ON}$ is 3V, and the off voltage $V_{OFF}$ is 0V. The bias voltages and the pulse width T may be varied according to the practical requirements. For example, in some cases, the bit lines BL2 and BL3 receive the ground voltage (0V).

Please refer to FIG. 3 again. As mentioned above, the bit lines BL2 and BL3 are in the floating state. Consequently, regardless of whether the word lines WL1~WL3 are activated or inactivated, the storage states of the OTP memory cells c12, c22 and c32 in the second column of the memory cell array and the OTP memory cells c13, c23 and c33 in the third column of the memory cell array are kept unchanged.

In the first column of the memory cell array, the antifuse control line AF receives the program pulse, the bit line BL1 receives the ground voltage (0V), the word line WL1 receives the on voltage $V_{ON}$, and the other word lines WL2 and WL3 receive the off voltage $V_{OFF}$. Consequently, the OTP memory cell c11 is a selected memory cell, and the OTP memory cells c21 and c31 are unselected memory cells.

In the OTP memory cell c11, the select transistor $M_{S1}$ is turned on. Under this circumstance, the gate oxide layer of the antifuse transistor $M_{AF1}$ is ruptured, and a program current $I_P$ is generated. Consequently, the OTP memory cell c11 is programmed to a low-resistance storage state.

In the OTP memory cell c21, the select transistor $M_{S2}$ is turned off. Under this circumstance, the gate oxide layer of the antifuse transistor $M_{AF2}$ is not ruptured. Consequently, the OTP memory cell c21 is maintained in a high-resistance storage state. Similarly, the select transistor $M_{S3}$ of the OTP memory cell c31 is turned off. Since the gate oxide layer of the antifuse transistor $M_{AF3}$ is not ruptured. Consequently, the OTP memory cell c31 is maintained in the high-resistance storage state.

As mentioned above, the antifuse control line AF receives the program pulse, and the bit line BL1 receives the ground voltage (0V). Although the word lines WL2 and WL3 are inactivated, the OTP memory cell c21 generates a leakage current $I_{L2}$ and the OTP memory cell c31 generates a leakage current $I_{L3}$. In other words, the total current flowing through the antifuse control line AF may be expressed as: $I_{AF}=I_P+I_{L2}+I_{L3}$.

As mentioned above, the program pulse is provided when the program action is performed on the OTP memory cell. The pulse height of the program pulse is equal to a program voltage $V_{PP}$. The pulse width of the program pulse is T. However, due to the process variation of the semiconductor chip, it is unable to accurately predict the time when the gate oxide layer of the antifuse transistor $M_{AR}$ is ruptured.

For example, in some situations, the gate oxide layer of the antifuse transistor $M_{AR}$ is ruptured during the initial stage of providing the program pulse to the antifuse control line AF. Since the OTP memory cell c11 is over-programmed, the OTP memory cell c11 is suffered from deterioration. In some situations, the gate oxide layer of the antifuse transistor $M_{AR}$ is not ruptured after the duration of the pulse width T passes. Under this circumstance, it is necessary to increase the pulse height or the pulse width of the program pulse and then perform the program action again.

SUMMARY OF THE INVENTION

An embodiment of the present invention provides a program control circuit. The program control circuit is coupled to an antifuse control line of an antifuse-type one time programming memory cell array. The program control circuit generates a program voltage to program a selected memory cell of the antifuse-type one time programming memory cell array. The program control circuit includes a program voltage generator, a program voltage adjustment circuit, a proportional current generator, a current sampling circuit, a first switch, a second switch, a current mirror and a detection circuit. An output terminal of the program voltage generator is coupled to the antifuse control line. In a calibration phase of a program action, the program voltage generator generates a calibration voltage to the antifuse control line. In at least one program phase of the program action, the program voltage generator generates the program voltage to the antifuse control line. The program voltage adjustment circuit is connected to the program voltage generator. The program voltage adjustment circuit receives a rupture signal. The program voltage adjustment circuit selectively adjusts the program voltage when the rupture signal is not activated. The proportional current generator is connected to the program voltage generator. In the calibration phase, the proportional current generator generates a calibration current to a first node. In the at least one program phase, the proportional current generator generates an operation current to the first node. The current sampling circuit is connected to the first node. In the calibration phase, the current sampling circuit converts the calibration current into a sampling voltage. In the at least one program phase, the current sampling circuit generates the calibration current according to the sampling voltage. The calibration current flows from the first node to a ground terminal. A first terminal of the first switch is connected to the first node. A first terminal of the second switch is connected to the first node. In the calibration phase, the first switch and the second switch are in an opened state. In the at least one program phase, the first switch and the second switch are in a closed state. A current input terminal of the current mirror receives a first reference program current. A current mirrored terminal of the current mirror generates a second reference program current and the current mirrored terminal is connected to a second terminal of the first switch. In the at least one program phase, the second reference program current flows from the first node to the current mirrored terminal of the current mirror. The detection circuit is connected to a second terminal of the second switch. In the at least one program phase, the detection circuit judges a magnitude of a program current generated by the selected memory cell. If the detection circuit judges that the program current is sufficient, the rupture signal is activated by the detection circuit.

Numerous objects, features and advantages of the present invention will be readily apparent upon a reading of the following detailed description of embodiments of the present invention when taken in conjunction with the accompanying drawings. However, the drawings employed herein are for the purpose of descriptions and should not be regarded as limiting.

BRIEF DESCRIPTION OF THE DRAWINGS

The above objects and advantages of the present invention will become more readily apparent to those ordinarily skilled in the art after reviewing the following detailed description and accompanying drawings, in which:

FIGS. 1A and 1B (prior art) are schematic equivalent circuit diagrams illustrating two conventional antifuse-type OTP memory cells;

FIG. 2A (prior art) schematically illustrates associated bias voltages for performing a program action on the conventional OTP memory cell as shown in FIG. 1A;

FIG. 2B (prior art) schematically illustrates associated bias voltages for performing a program inhibition action on the conventional OTP memory cell as shown in FIG. 1A;

FIG. 3 (prior art) is a schematic circuit diagram illustrating an OTP memory cell array and associated bias voltages while a program action is performed;

DETAILED DESCRIPTION OF PREFERRED EMBODIMENTS

The present invention provides a program control circuit for an antifuse-type one time programming memory cell array. When a program action is performed, the program control circuit does not provide a program pulse. Moreover, when the program action is performed, the program control circuit monitors the program current from the OTP memory cell in real time and increases the program voltage at proper time. When the program control circuit judges that the program current generated by the OTP memory cell is sufficient, the program control circuit confirms that the program action is completed.

Figure 4A:
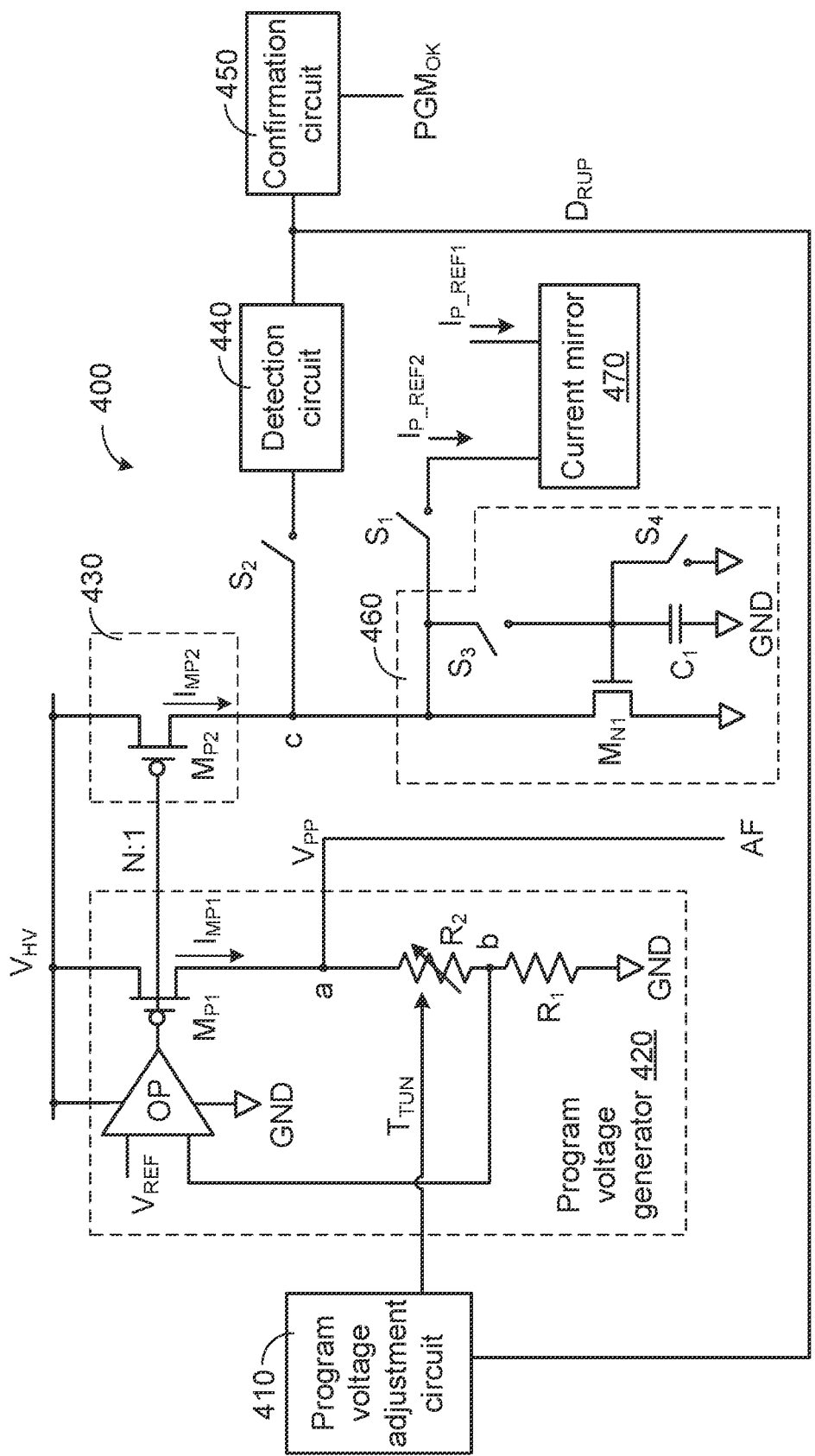
FIG. 4A is a schematic circuit diagram illustrating a program control circuit for an antifuse-type one time programming memory cell array according to a first embodiment of the present invention.
Figure 4B:
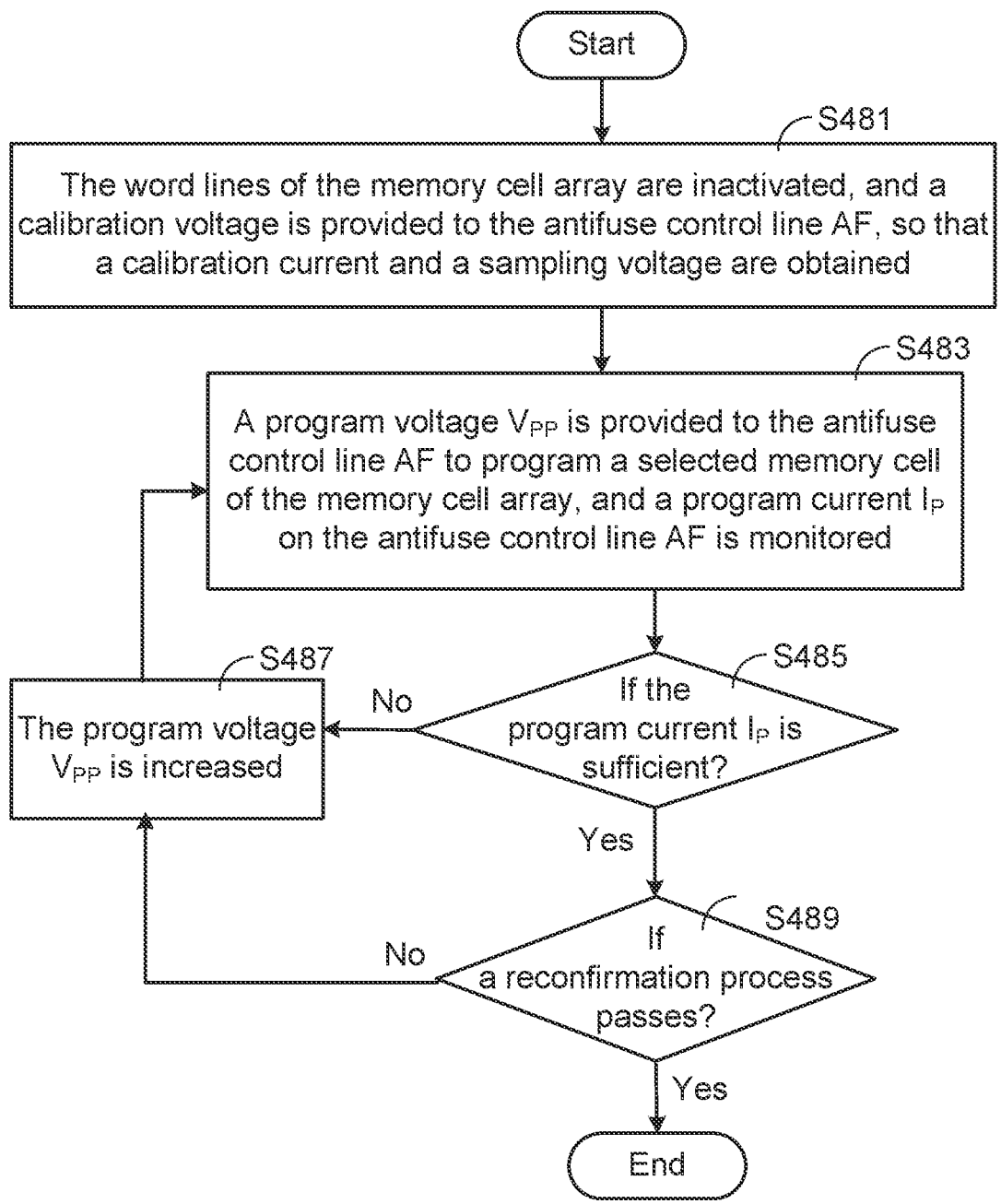
FIG. 4B is a flowchart of a program control method for the program control circuit according to the first embodiment of the present invention.

Please refer to FIGS. 4A and 4B. FIG. 4A is a schematic circuit diagram illustrating a program control circuit for an antifuse-type one time programming memory cell array according to a first embodiment of the present invention. FIG. 4B is a flowchart of a program control method for the program control circuit according to the first embodiment of the present invention. The program control circuit 400 comprises a program voltage adjustment circuit 410, a program voltage generator 420, a proportional current generator 430, a detection circuit 440, a confirmation circuit 450, a current sampling circuit 460, a current mirror 470, and two switches $S_1$, $S_2$. In some embodiments, the detection circuit 440 can be implemented by a voltage detector or a current detector.

The output terminal of the program control circuit 400 at node a is coupled to an antifuse control line AF of the memory cell array. In addition, the output terminal of the program control circuit 400 generates a program voltage $V_{PP}$. For example, the output terminal of the program control circuit 400 is coupled to the antifuse control line AF of the memory cell array as shown in FIG. 3. Of course, in some other embodiments, the output terminal of the program control circuit 400 may be coupled to the antifuse control line AF of another memory cell array.

During the program action, the program control circuit 400 can program a selected memory cell of the memory cell array. Moreover, the program action includes a calibration phase and at least one program phase. The operations of the program control circuit 400 will be described as follows in more details.

The program voltage generator 420 comprises an operational amplifier OP, a transistor $M_{P1}$, a resistor $R_1$ and a resistor $R_2$. The first input terminal of the operational amplifier OP receives a reference voltage $V_{REF}$. The source terminal of the transistor $M_{P1}$ receives a supply voltage $V_{HV}$. The gate terminal of the transistor $M_{P1}$ is connected to the output terminal of the operational amplifier OP. The drain terminal of the transistor $M_{P1}$ is connected to a node a, which is also referred as a second node. The node a is the output terminal of the program control circuit 400. The node a is coupled to the antifuse control line AF to provide the program voltage $V_{PP}$ to the antifuse control line AF. The two resistors $R_1$ and $R_2$ are connected between the node a and a ground terminal GND in series. Moreover, the two resistors $R_1$ and $R_2$ are connected to a node b, which is also referred as a third node. The node b is connected to the second input terminal of the operational amplifier OP. The supply voltage $V_{HV}$ is higher than the program voltage $V_{PP}$. The program voltage $V_{PP}$ is higher than the reference voltage $V_{REF}$. The reference voltage $V_{REF}$ is higher than the ground voltage (0V).

Moreover, the relationship between the program voltage $V_{PP}$ and the reference voltage $V_{REF}$ may be expressed as: $V_{PP}=(1+R_2/R_1) \times V_{REF}$. The reference voltage $V_{REF}$ has a fixed value. The resistor $R_1$ has a fixed resistance value. The resistor $R_2$ is a variable resistor. As the resistance of the resistor $R_2$ increases, the value $R_2/R_1$ increases. Consequently, the magnitude of the program voltage $V_{PP}$ increases. It is noted that numerous modifications and alterations may be made while retaining the teachings of the invention. For example, in another embodiment, the resistor $R_1$ of the program voltage generator 420 is a variable resistor, and the resistor $R_2$ has a fixed resistance value. By adjusting the ratio of the resistance value of the resistor $R_2$ to the resistance value of the resistor $R_1$, the magnitude of the program voltage $V_{PP}$ is correspondingly changed.

The program voltage adjustment circuit 410 is connected to the program voltage generator 420. The program voltage adjustment circuit 410 generates an adjustment signal $T_{TUN}$ to adjust the value $R_2/R_1$ of the program voltage generator 420 and correspondingly change the program voltage $V_{PP}$. Moreover, the program voltage adjustment circuit 410 receives a rupture signal $D_{RUP}$. In the calibration phase of the program action, the program voltage generator 420 generates the VPP voltage as a calibration voltage according to the adjustment signal $T_{TUN}$ from the program voltage adjustment circuit 410. The program voltage $V_{PP}$ is transmitted to the memory cell array through the antifuse control line AF. In the program phase of the program action, the value $R_2/R_1$ of the program voltage generator 420 is increased according to the adjustment signal $T_{TUN}$ from the program voltage adjustment circuit 410. Consequently, the program voltage $V_{PP}$ is increased until the rupture signal $D_{RUP}$ is activated. In an embodiment, the adjustment signal $T_{TUN}$ is a digital code. The lower value of the digital code represents that the magnitude of the program voltage $V_{PP}$ outputted from the program voltage generator 420 is lower.

The higher value of the digital code represents that the magnitude of the program voltage $V_{PP}$ outputted from the program voltage generator 420 is higher. It is noted that the example of the adjustment signal $T_{TUN}$ is not restricted. For example, in another embodiment, the adjustment signal $T_{TUN}$ is an analog signal.

The proportional current generator 430 comprises a transistor $M_{P2}$. The source terminal of the transistor $M_{P2}$ receives the supply voltage $V_{HV}$. The gate terminal of the transistor $M_{P2}$ is connected to the output terminal of the operational amplifier OP. The drain terminal of the transistor $M_{P2}$ is connected to a node c, which is also referred as a first node. During the normal operation, there is a proportional relationship between the current $I_{MP1}$ flowing through the transistor $M_{P1}$ and the current $I_{MP2}$ flowing through the transistor $M_{P2}$. The proportional relationship is determined according to the sizes of the transistors $M_{P1}$ and $M_{P2}$. For example, the size of the transistor $M_{P1}$ is N time the size of the transistor $M_{P2}$. Consequently, the relationship between the current $I_{MP1}$ and the current $I_{MP2}$ may be expressed as: $I_{MP2}=(1/N) \times I_{MP1}$. If N=2 the size of the transistor $M_{P1}$ is 2 times the size of the transistor $M_{P2}$, and $I_{MP2}=(1/2) \times I_{MP1}$.

The first terminal of the switch $S_2$ is connected to the node c. The second terminal of the switch $S_2$ is connected to the detection circuit 440. In the calibration phase of the program action, the switch $S_2$ is in an opened state. Consequently, the node c is not connected to the detection circuit 440. In the program phase of the program action, the switch $S_2$ is in a closed state. Consequently, the node c is connected to the detection circuit 440 so as to form a current detecting path between the node c and the detection circuit 440. Meanwhile, the detection circuit 440 detects whether any current flows to the detection circuit 440 through the current detecting path, or the detection circuit 440 can detect whether a voltage level at the node c is greater than a predetermined threshold voltage. If the detection circuit 440 detects that a current flows to the detection circuit 440 or the detection circuit 440 detects that the voltage level at the node c is greater than the predetermined threshold voltage, it means that the magnitude of the program current $I_p$ is sufficient. Under this circumstance, the detection circuit 440 judges that the gate oxide layer of the antifuse transistor in the OTP memory cell is ruptured, and the rupture signal $D_{RUP}$ is activated by the detection circuit 440. In an embodiment, the detection circuit 440 is implemented with a current comparator. If the current in the current detecting path is higher than a threshold current, the rupture signal $D_{RUP}$ is activated by the current comparator. In an embodiment, the detection circuit 440 is implemented with a voltage comparator. If the voltage level at the node c is greater than the predetermined threshold voltage, the rupture signal $D_{RUP}$ is activated by the voltage comparator.

The confirmation circuit 450 is connected to the detection circuit 440 to receive the rupture signal $D_{RUP}$ from the detection circuit 440. When the rupture signal $D_{RUP}$ is activated, the confirmation circuit 450 judges whether the rupture signal $D_{RUP}$ has been activated for a specified time duration. If the rupture signal $D_{RUP}$ has been activated for the specified time duration, the confirmation circuit 450 generates an activated program completion signal $PGM_{OK}$ to indicate that the program action on the OTP memory cell has been completed.

The current sampling circuit 460 is connected to the node c. In an embodiment, the current sampling circuit 460 comprises a transistor $M_{N1}$, two switches $S_3$, $S_4$, and a capacitor $C_1$. The drain terminal of the transistor $M_{N1}$ is connected to the node c. The source terminal of the transistor $M_{N1}$ is connected to the ground terminal GND. The first terminal of the capacitor $C_1$ is connected to the gate terminal of the transistor $M_{N1}$. The second terminal of the capacitor $C_1$ is connected to the ground terminal GND. The first terminal of the switch $S_4$ is connected to the gate terminal of the transistor $M_{N1}$. The second terminal of the switch $S_4$ is connected to the ground terminal GND. The first terminal of switch $S_3$ is connected to node c. The second terminal of switch $S_3$ is connected to the gate terminal of transistor $M_{N1}$.

Before the program action is performed, the switch $S_4$ is in the closed state. Consequently, the capacitor $C_1$ is reset. In the calibration phase of the program action, the switch $S_4$ is in an opened state and the switch $S_3$ is in the closed state. Consequently, the calibration current flows through the transistor $M_{N1}$ and the capacitor $C_1$ stores a sampling voltage. In the program phase of the program action, the switches $S_3$ and $S_4$ are in the opened state. Consequently, the transistor $M_{N1}$ generates the calibration current according to the sampling voltage stored in the capacitor $C_1$.

The first terminal of the switch $S_1$ is connected to the node c. The second terminal of the switch $S_1$ is connected to the current mirrored terminal of the current mirror 470. The current input terminal of the current mirror 470 receives a reference program current $I_{P\_REF1}$. In the calibration phase of the program action, the switch $S_1$ is in the opened state. In the program phase of the program action, the switch $S_1$ is in the closed state. Consequently, in the program phase of the program action, the current mirror 470 generates the reference program current $I_{P\_REF2}$ at the current mirrored terminal according to the reference program current $I_{P\_REF1}$ received by the current input terminal and a predetermined size ratio between the transistors at the current mirrored terminal and the current input terminal. Generally, the reference program current $I_{P\_REF2}$ is set as a current corresponding to the minimum program current that is generated when the OTP memory cell is successfully programmed.

Please refer to FIG. 4B. The flowchart of the program control method will be described as follows. After the program action is started and the word lines of the memory cell array are inactivated in the calibration phase, a calibration voltage is provided to the antifuse control line AF. Consequently, a calibration current and a sampling voltage are obtained (Step S481). Then, in the program phase, a program voltage $V_{PP}$ is provided to the antifuse control line AF to program a selected memory cell of the memory cell array, and a program current $I_P$ on the antifuse control line AF is monitored (Step S483) to determine whether the program current $I_P$ is sufficient or not. If the program current $I_P$ on the antifuse control line AF is insufficient (Step S485), the program voltage $V_{PP}$ is increased (Step S487), and the step S483 is repeatedly performed. Whereas, if the program current $I_P$ on the antifuse control line AF is sufficient (Step S485), a reconfirmation process is performed (Step S489). If the reconfirmation process indicates that the program current $I_P$ on the antifuse control line AF is sufficient, the program action is completed. Whereas, if the reconfirmation process fails, the step S487 is repeatedly performed.

Figure 5A:
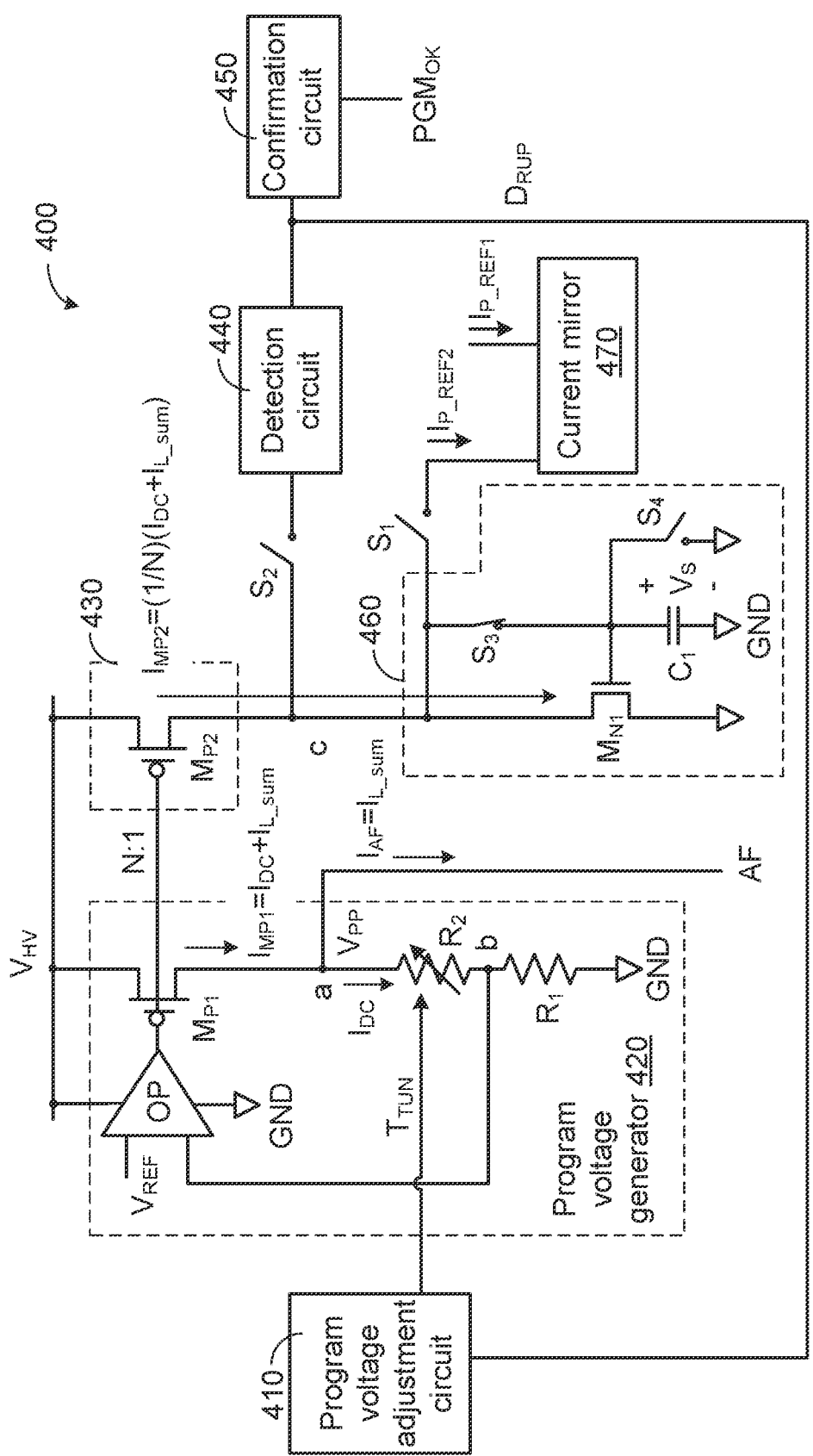
FIGS. 5A and 5B are schematic circuit diagrams illustrating the operations of the program control circuit of FIG. 4A in the program phase.
Figure 5B:
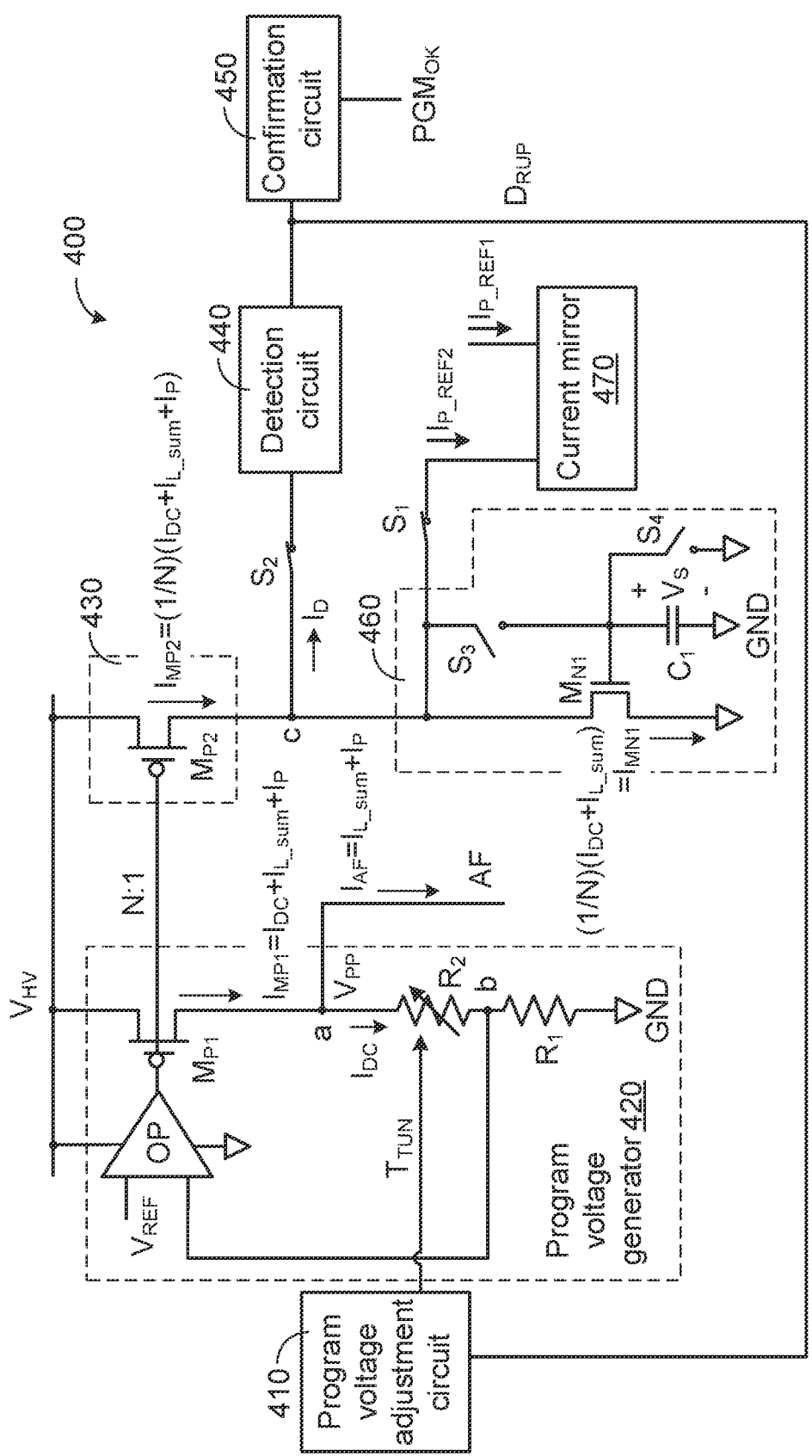
Figure 5C:
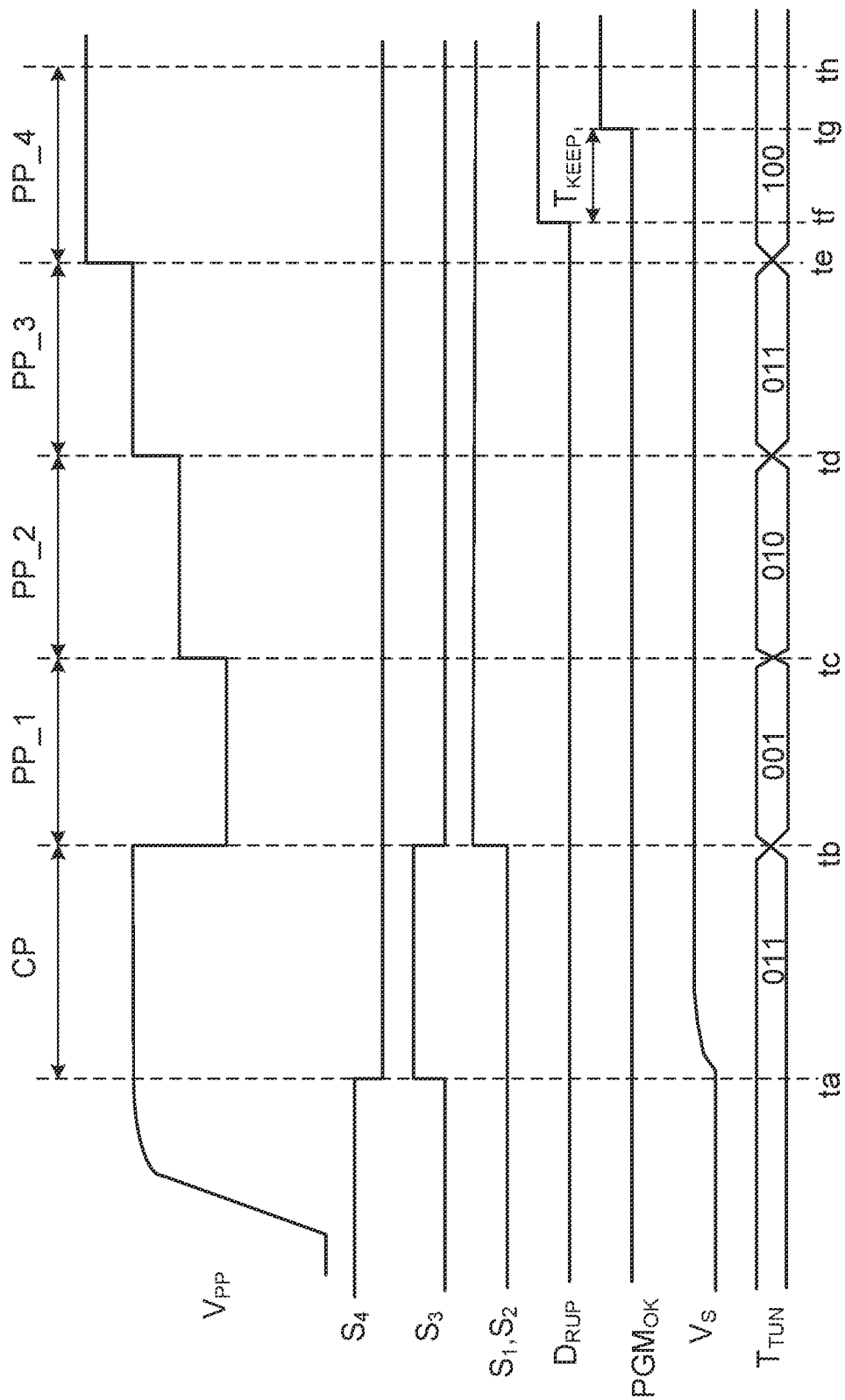
FIG. 5C is a schematic timing waveform diagram illustrating associated signals of the program control circuit of FIG. 4A in the program phase.

FIGS. 5A and 5B are schematic circuit diagrams illustrating the operations of the program control circuit of FIG. 4A in the program action. FIG. 5C is a schematic timing waveform diagram illustrating associated signals of the program control circuit of FIG. 4A in the program action. Before the program action is performed, the switch $S_4$ is in the closed state, and the switches $S_1$, $S_2$ and $S_3$ are in the opened state. Consequently, the capacitor $C_1$ is reset.

The step S481 represents the calibration phase of the program action. In the calibration phase, the switch $S_3$ is in the closed state, and the switches $S_1$, $S_2$ and $S_4$ are in the opened state. In addition, the word lines of the memory cell array are all inactivated. Please refer to FIG. 5A. In the calibration phase, the voltage $V_{PP}$ is used as the calibration voltage.

Since the word lines of the memory cell array are all inactivated, the output current $I_{AF}$ from the antifuse control line AF is equal to the total leakage current $I_{L\_sum}$ from the plural OTP memory cells of the memory cell array, i.e., $I_{AF}=I_{L\_sum}$. In addition, the two resistors $R_1$ and $R_2$ of the program voltage generator 420 generates a DC current $I_{DC}$. Consequently, the internal current of the program voltage generator 420 is equal to the current $I_{MP1}$ flowing through the transistor $M_{P1}$, i.e., $I_{MP1}=I_{DC}+I_{L\_sum}$. Moreover, the current $I_{MP2}$ generated by the proportional current generator 430 is proportional to the current $I_{MP1}$. In other words, $I_{MP2}=(1/N)\times(I_{DC}+I_{L\_sum})$. In the calibration phase, the current $I_{MP2}$ flowing through the transistor $M_{P2}$ is a calibration current. Moreover, the current $I_{MP2}$ flows to the transistor $M_{N1}$ of the current sampling circuit 460. Consequently, a sampling voltage $V_S$ is stored in the capacitor $C_1$ in responding to the current $I_{MP2}$.

The step S483 represents the program phase of the program action. In the program phase, the switches $S_1$ and $S_2$ are in the closed state, and the switches $S_3$ and $S_4$ are in the opened state. Meanwhile, one word line of the memory cell is activated, and a selected memory cell of the memory cell array is determined. Please refer to FIG. 5B. In the program phase, the program voltage generator 420 provides the voltage $V_{PP}$ as the program voltage to the antifuse control line AF to program the selected memory cell.

In the program phase of the program action, the output current $I_{AF}$ from the antifuse control line AF is equal to the total leakage current $I_{L\_sum}$ from the plural OTP memory cells of the memory cell array plus the program current $I_P$, i.e., $I_{AF}=I_{L\_sum}+I_P$. Of course, before the selected memory cell is programmed successfully, the program current $I_P$ is zero. In addition, the two resistors $R_1$ and $R_2$ of the program voltage generator 420 generate a DC current $I_{DC}$. Consequently, the internal current of the program voltage generator 420 is equal to the current $I_{MP1}$ flowing through the transistor $M_{P1}$, i.e., $I_{MP1}=I_{DC}+I_{L\_sum}+I_P$. Moreover, the current $I_{MP2}$ generated by the proportional current generator 430 is equal to the current $(1/N)\times I_{MP1}$. In other words, $I_{MP2}=(1/N)\times(I_{DC}+I_{L\_sum}+I_P)$. In the program phase, the current $I_{MP2}$ flowing through the transistor $M_{P2}$ is an operation current.

In the program phase, the sampling voltage $V_S$ is still stored in the capacitor C1 Consequently, the current $I_{MN1}$ flowing through the transistor $M_{N1}$ of the current sampling circuit 460 is equal to the calibration current. That is, $I_{MN1}=(1/N)\times(I_{DC}+I_{L\_sum})$. Moreover, the current mirror 470 generates a reference program current $I_{P\_REF2}$ at the current mirrored terminal of the current mirror 470.

In an embodiment, the current detecting path is connected between the node c and the detection circuit 440. The magnitude of the detecting current $I_D$ on the current detecting path is determined according to the current $I_{MP2}$ and the current $(I_{MN1}+I_{P\_REF2})$. That is, the judging step S485 can be performed according to the result of comparing the current $I_{MP2}$ with the current $(I_{MN1}+I_{P\_REF2})$. For example, before the program action is completed, the program current $I_P$ generated by the selected memory cell is zero. Meanwhile, the magnitude of the current $I_{MP2}$ is lower than the magnitude of the current $(I_{MN1}+I_{P\_REF2})$. That is, no current flows through the current detecting path, and the detecting current $I_D$ is zero. Consequently, the rupture signal $D_{RUP}$ is not activated by the detection circuit 440. Whereas, after the program action is completed, the program current $I_P$ generated by the selected memory cell is sufficient. That is, the magnitude of the current $I_{MP2}$ is higher than the magnitude of the current ($I_{MN1}+I_{P\_REF2}$). That is, the detecting current $I_D$ higher than zero flows through the current detecting path. After the detecting current $I_D$ flows to the detection circuit 440, the rupture signal $D_{RUP}$ is activated by the detection circuit 440. As mentioned above, the reference program current $I_{P\_REF2}$ is a current corresponding to the minimum program current that is generated when the OTP memory cell is successfully programmed. For example, the reference program current $I_{P\_REF2}$ is (1/N) of the minimum program current that is generated when the OTP memory cell is successfully programmed.

In the program phase, if the rupture signal $D_{RUP}$ is not activated, it means that the magnitude of the program current $I_P$ is insufficient. Meanwhile, the program voltage adjustment circuit 410 enters a next program phase of the program action. That is, the step S487 is performed. The program voltage adjustment circuit 410 issues an adjustment signal $T_{TUN}$ to increase the value $R_2/R_1$ of the program voltage generator 420 and correspondingly increase the program voltage $V_{PP}$. In case that the rupture signal $D_{RUP}$ is activated, it means that the magnitude of the program current $I_P$ is sufficient. Meanwhile, the value $R_2/R_1$ of the program voltage generator 420 is not changed by the program voltage adjustment circuit 410, and the program voltage $V_{PP}$ is not changed.

After the rupture signal $D_{RUP}$ is activated, the confirmation circuit 450 judges whether the rupture signal $D_{RUP}$ has been activated for a specified time duration. If the confirmation circuit 450 confirms that the rupture signal $D_{RUP}$ has been activated for the specified time duration, the confirmation circuit 450 generates an activated program completion signal $PGM_{OK}$ to indicate that the program action on the OTP memory cell has been completed.

Please refer to FIG. 5C. The time interval between the time point ta and the time point th is the program action. The time interval between the time point ta and the time point tb is the calibration phase CP. The time interval between the time point tb and the time point th is divided into four program phases PP_1, PP_2, PP_3 and PP_4 and the time interval of the program phase PP_1, PP_2, PP_3, and PP_4 are adjustable. For example, the adjustment signal $T_{TUN}$ is a 3-bit digital code. The lower value of the digital code represents that the magnitude of the adjusted program voltage $V_{PP}$ is lower. The higher value of the digital code represents that the magnitude of the adjusted program voltage $V_{PP}$ is higher.

Before the program action is performed (i.e., before the time point ta), the switch $S_4$ is in the closed state, and the switches $S_1$, $S_2$ and $S_3$ are in the opened state. Consequently, the capacitor $C_1$ is reset.

In the calibration phase CP (i.e., in the time interval between the time point ta and the time point tb), the switch $S_3$ is in the closed state, and the switches $S_1$, $S_2$ and $S_4$ are in the opened state. In the calibration phase CP, the adjustment signal $T_{TUN}$ is <011>, and the program voltage generator 420 provides a calibration voltage to the antifuse control line AF. The voltage $V_{PP}$, which is the output voltage of the program voltage generator 420, is used as the calibration voltage. Moreover, the proportional current generator 430 generates the calibration current. Consequently, a sampling voltage $V_s$ is stored in the capacitor $C_1$.

In the first program phase PP_1 (i.e., in the time interval between the time point tb and the time point tc), the switches $S_3$ and $S_4$ are in the opened state, and the switches $S_1$ and $S_2$ are in the closed state. In the first program phase PP_1, the adjustment signal $T_{TUN}$ is <001>, and the program voltage generator 420 provides a lower program voltage $V_{PP}$ to the antifuse control line AF. At the end time point tc of the first program phase PP_1, the rupture signal $D_{RUP}$ is not activated. Since the magnitude of the program current $I_P$ is insufficient, the selected memory cell has not been programmed successfully.

In the second program phase PP_2 (i.e., in the time interval between the time point tc and the time point td), the adjustment signal $T_{TUN}$ is <010>, and the program voltage generator 420 provides an increased program voltage $V_{PP}$ to the antifuse control line AF. At the end time point td of the second program phase PP_2, the rupture signal $D_{RUP}$ is not activated. Since the magnitude of the program current $I_P$ is insufficient, the selected memory cell has not been programmed successfully.

In the third program phase PP_3 (i.e., in the time interval between the time point td and the time point te), the adjustment signal $T_{TUN}$ is <011>, and the program voltage generator 420 provides the increased program voltage $V_{PP}$ to the antifuse control line AF. At the end time point te of the third program phase PP_3, the rupture signal $D_{RUP}$ is not activated. Since the magnitude of the program current $I_P$ is insufficient, the selected memory cell has not been programmed successfully.

In the fourth program phase PP_4 (i.e., in the time interval between the time point to and the time point th), the adjustment signal $T_{TUN}$ is <100>, and the program voltage generator 420 provides the increased program voltage $V_{PP}$ to the antifuse control line AF. At the time point tf, the rupture signal $D_{RUP}$ is activated. Since the magnitude of the program current $I_P$ is sufficient, it means that the selected memory cell is possibly programmed successfully. After the rupture signal $D_{RUP}$ has been activated for a specified time duration $T_{KEEP}$, at the time point tg, the confirmation circuit 450 generates a program completion signal $PGM_{OK}$ to indicate that the program action on the OTP memory cell has been completed.

Since the program action on the OTP memory cell has been completed, the adjustment signal $T_{TUN}$ is maintained at <100> at the end time point th of the fourth program phase PP_4. Consequently, the program voltage $V_{PP}$ is kept unchanged. Of course, if the program action is not performed successfully after the fourth program phase PP_4, the program voltage adjustment circuit 410 enters a next program phase until the program action is performed successfully.

At the time point tg, the selected memory cell has been completed. Although the magnitude of the program voltage $V_{PP}$ is not changed, the selected memory cell is possibly over-programmed. For avoiding the occurrence of the over-programmed condition, a switching circuit (not shown) is provided. According to the program completion signal $PGM_{OK}$, the antifuse control line AF is switched to a low voltage source (e.g., a ground voltage or a 3.3V logic voltage). Consequently, the selected memory cell is not over-programmed after the time point tg.

From the above descriptions, the present invention provides a program control circuit for an antifuse-type one time programming memory cell array. When the program action is performed, the program control circuit monitors the program current from the OTP memory cell in real time and increases the program voltage at proper time. When the program control circuit judges that the program current generated by the OTP memory cell is sufficient, the program control circuit confirms that the program action is completed.

Figure 6:
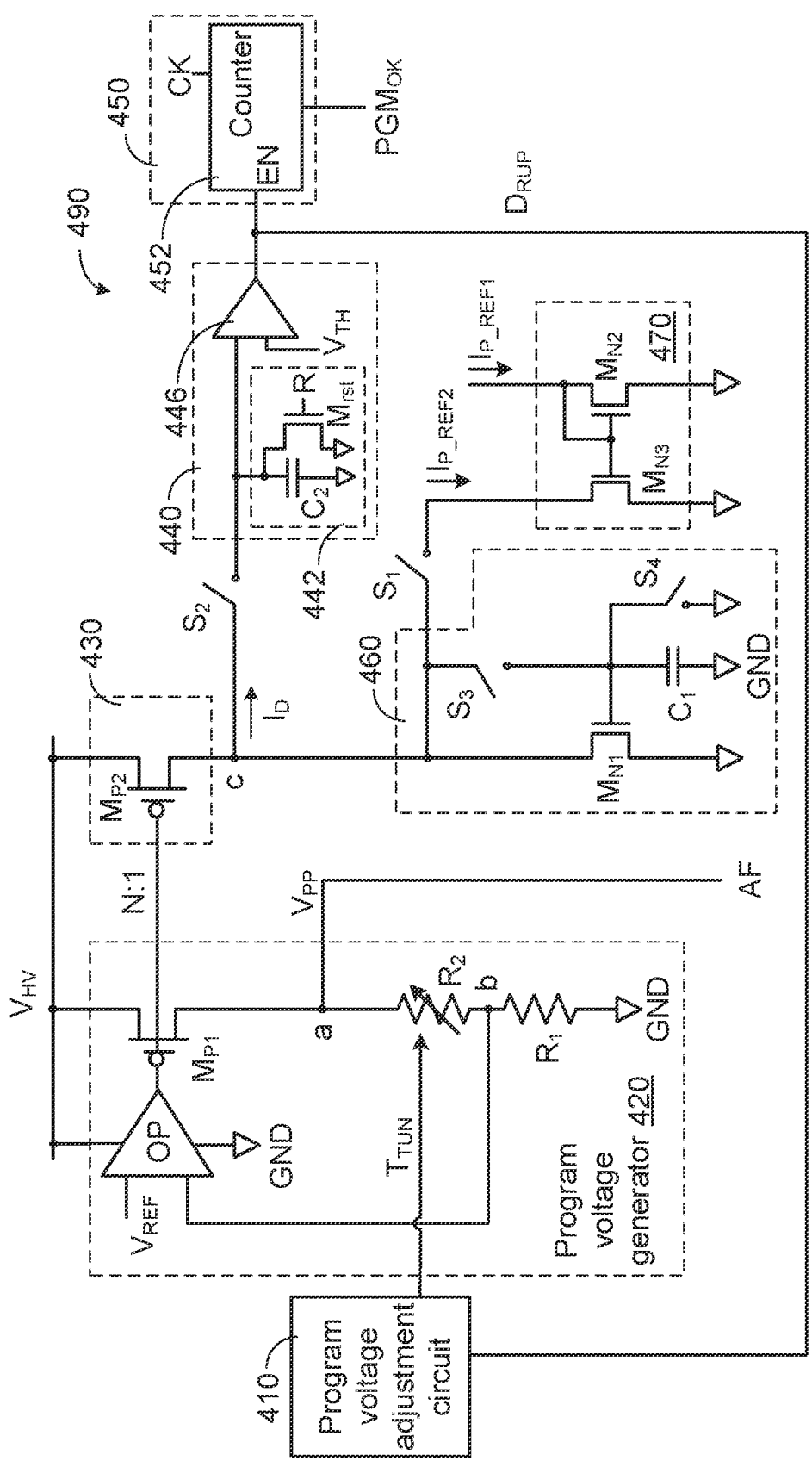
FIG. 6 is a schematic circuit diagram illustrating a program control circuit for an antifuse-type one time programming memory cell array according to a second embodiment of the present invention.

The detailed circuitry structure of the program control circuit will be described as follows in more details. FIG. 6 is a schematic circuit diagram illustrating a program control circuit for an antifuse-type one time programming memory cell array according to a second embodiment of the present invention. In comparison with the first embodiment, the detailed circuitry structures of the detection circuit 440, the current mirror 470 and the confirmation circuit 450 of the program control circuit 490 of this embodiment will be described as follows.

The current mirror 470 comprises two transistors $M_{N2}$ and $M_{N3}$. The drain terminal of the transistor $M_{N2}$ is the current input terminal of the current mirror 470 to receive the reference program current $I_{P\_REF1}$. The drain terminal of the transistor $M_{N2}$ and the gate terminal of the transistor $M_{N2}$ are connected with each other. The source terminal of the transistor $M_{N2}$ is connected to the ground terminal GND. The drain terminal of the transistor $M_{N3}$ is the current mirrored terminal of the current mirror 470 to generate the reference program current $I_{P\_REF2}$. The gate terminal of the transistor $M_{N3}$ is connected to the gate terminal of the transistor $M_{N2}$. The source terminal of the transistor $M_{N3}$ is connected to the ground terminal GND. The ratio of the two reference program currents $I_{P\_REF1}$ and $I_{P\_REF2}$ is determined by the ratio of the sizes of the two transistors $M_{N2}$ and $M_{N3}$.

In some situations, the supply voltage $V_{HV}$ is provided by a charge pump. The supply voltage $V_{HV}$ supplied by the charge pump is relatively unstable, which will produce ripples and cause noises and the detecting current $I_D$ will be affected by the ripples and cause noise. Accordingly, the detection circuit 440 comprises an integration circuit 442 and a comparator 446. The integration circuit 442 can accumulate the detecting current $I_D$ over a defined time to produce a stable output, such that the comparator 446 can output a stable rupture signal $D_{RUP}$, which improves the reliability of the program completion signal $PGM_{OK}$. In detail, the integration circuit 442 comprises a capacitor C2 and a reset transistor $M_{rst}$. The first terminal of the capacitor C2 is connected to the second terminal of the switch $S_2$. The second terminal of the capacitor C2 is connected to the ground terminal GND. The drain terminal of the reset transistor $M_{rst}$ is connected to the second terminal of the switch $S_2$. The source terminal of the reset transistor $M_{rst}$ is connected to the ground terminal. The gate terminal of the reset transistor $M_{rst}$ receives a reset signal R. The first terminal of the comparator 446 is connected to the second terminal of the switch $S_2$. The second terminal of the comparator 446 receives a threshold voltage $V_{TH}$. The output terminal of the comparator 446 generates the rupture signal $D_{RUP}$. In other words, the detecting current $I_D$ can charge the capacitor $C_2$ of the integration circuit 442 and the judging step S485 that determining the program current is sufficient can be performed by determining whether the voltage of the capacitor $C_2$ is higher than the threshold voltage $V_{TH}$. If the voltage of the capacitor $C_2$ is higher than the threshold voltage $V_{TH}$ then it is determined that the magnitude of the current $I_{MP2}$ is higher than the magnitude of the current $(I_{MN1}+I_{P\_REF2})$ or the program current $I_P$ generated by the selected memory cell is sufficient, and the rupture signal $D_{RUP}$ is activated by the comparator 446.

The confirmation circuit 450 comprises a counter 452. The counter 452 receives a clock signal CK. The enabling terminal EN of the counter 452 receives the rupture signal $D_{RUP}$. When the rupture signal $D_{RUP}$ is activated, the counter 452 starts to count. When the counter 452 counts to a specified number, it means that the rupture signal $D_{RUP}$ has been activated for a specified time duration $T_{KEEP}$. Meanwhile, the counter 452 generates an activated program completion signal $PGM_{OK}$ to indicate that the program action on the OTP memory cell has been completed. Conversely, when the activation time of the rupture signal $D_{RUP}$ is less than the specified time duration $T_{KEEP}$, the counter 452 cannot count to the specified number. Under the circumstances, the counter 452 is reset and an activated program completion signal $PGM_{OK}$ is not generated. Until the next time, when the rupture signal $D_{RUP}$ is activated again, the counter 452 starts counting.

Generally, the supply voltage $V_{HV}$ and the program voltage $V_{PP}$ are high voltages. If the transistors of the program control circuit are subjected to a high voltage stress, the transistors are possibly damaged. For solving this problem, the program control circuit may be further modified.

Figure 7:
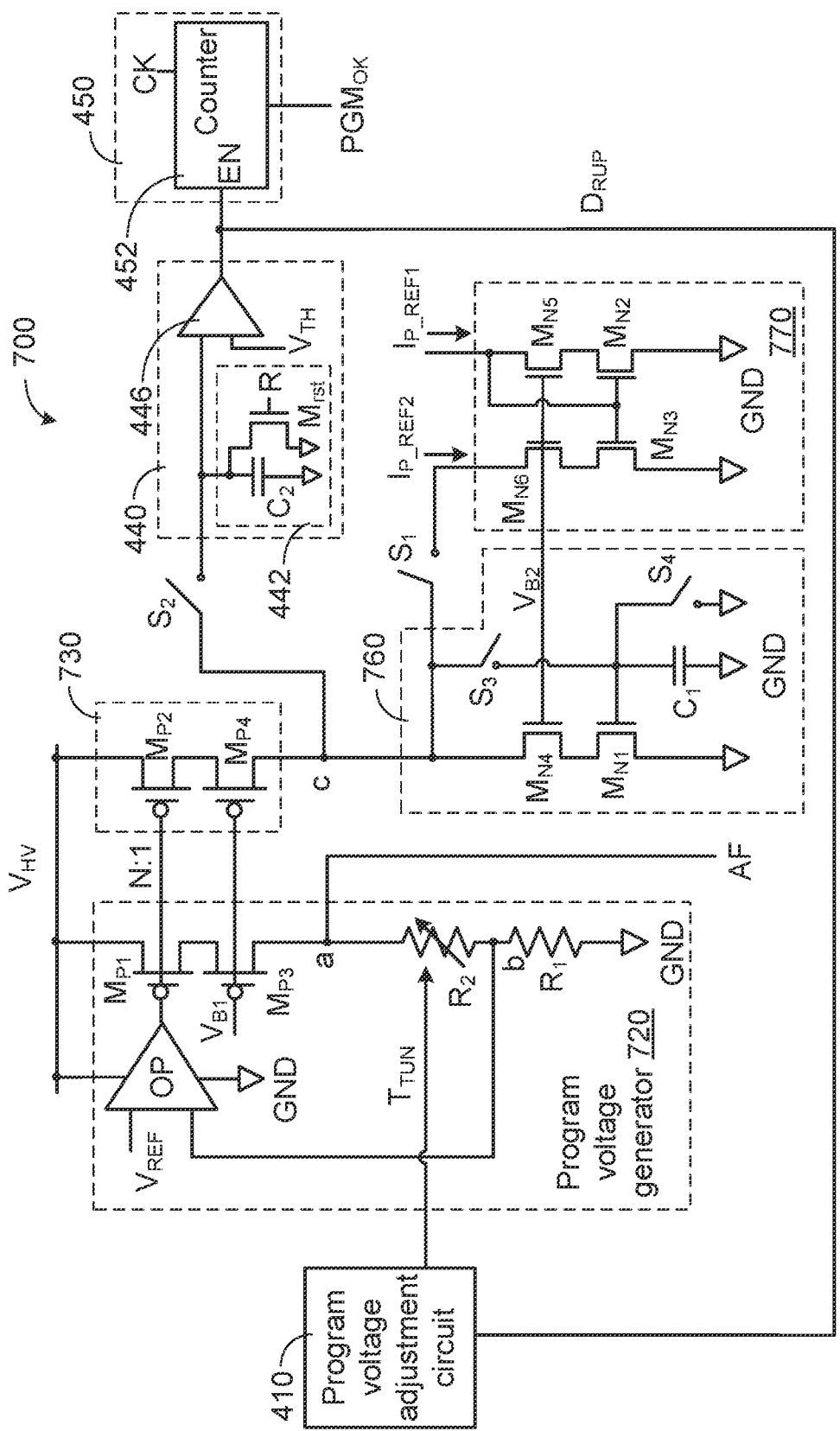
FIG. 7 is a schematic circuit diagram illustrating a program control circuit for an antifuse-type one time programming memory cell array according to a third embodiment of the present invention.

FIG. 7 is a schematic circuit diagram illustrating a program control circuit for an antifuse-type one time programming memory cell array according to a third embodiment of the present invention. In comparison with the program control circuit 490 of the second embodiment, the program control circuit 700 of this embodiment further comprises plural load devices $M_{P3}$, $M_{P4}$, $M_{N4}$, $M_{N5}$ and $M_{N6}$. The load device $M_{P3}$ is included in the program voltage generator 720. The load device $M_{P4}$ is included in the proportional current generator 730. The load device $M_{N4}$ is included in the current sampling circuit 760. The load devices $M_{N5}$ and $M_{N6}$ are included in the current mirror 770. Although the program control circuit 700 of this embodiment further comprises the plural load devices $M_{P3}$, $M_{P4}$, $M_{N4}$, $M_{N5}$ and $M_{N6}$, the operating principles of the program control circuit 700 are similar to those of the program control circuit 490. In this embodiment, the plural load devices $M_{P3}$, $M_{P4}$, $M_{N4}$, $M_{N5}$ and $M_{N6}$ are transistors. Hereinafter, the connecting relationships between these load devices and the associated components will be described as follows.

In the program voltage generator 720, the source terminal of the transistor $M_{P3}$ is connected to the drain terminal of the transistor MP1. The drain terminal of the transistor $M_{P3}$ is connected to node a. The gate terminal of the transistor $M_{P3}$ receives a first bias voltage $V_{B1}$.

In the proportional current generator 730, the source terminal of the transistor $M_{P4}$ is connected to the drain terminal of the transistor $M_{P2}$. The drain terminal of the transistor $M_{P4}$ is connected to the node c. The gate terminal of the transistor $M_{P4}$ receives the first bias voltage $V_{B1}$. In response to the first bias voltage $V_{B1}$, the transistors $M_{P3}$ and $M_{P4}$ are maintained in a conducting state.

In the current sampling circuit 760, the drain terminal of the transistor $M_{N4}$ is connected to the node c. The source terminal of the transistor $M_{N4}$ is connected to the drain terminal of the transistor $M_{N1}$. The gate terminal of the transistor $M_{N4}$ receives a second bias voltage $V_{B2}$.

In the current mirror 770, the drain terminal of the transistor $M_{N5}$ is the current input terminal of the current mirror 770 to receive a reference program current $I_{P\_REF1}$. The gate terminal of the transistor $M_{N5}$ receives the second bias voltage $V_{B2}$. The source terminal of the transistor $M_{N5}$ is connected to the drain terminal of the transistor $M_{N2}$. The gate terminal of the transistor $M_{N2}$ is connected to the drain terminal of the transistor $M_{N5}$. The source terminal of the transistor $M_{N2}$ is connected to the ground terminal GND. The drain terminal of the transistor $M_{N6}$ is the current mirrored terminal of the current mirror 770. The gate terminal of the transistor $M_{N6}$ receives the second bias voltage $V_{B2}$. The source terminal of the transistor $M_{N6}$ is connected to the drain terminal of the transistor $M_{N3}$. The gate terminal of the transistor $M_{N3}$ and the gate terminal of the transistor $M_{N2}$ are connected with each other. The source terminal of the transistor $M_{N3}$ is connected to the ground terminal GND. In response to the second bias voltage $V_{B2}$, the transistors $M_{N4}$, $M_{N5}$ and $M_{N6}$ are maintained in the conducting state.

It is noted that numerous modifications and alterations may be made while retaining the teachings of the invention. For example, in another embodiment, only the load devices $M_{P3}$ and $M_{P4}$ are included in the program voltage generator 720 and the proportional current generator 730. Alternatively, only the transistors $M_{N4}$, $M_{N5}$ and $M_{N6}$ are included in the current sampling circuit 760 and the current mirror 770.

Figure 8:
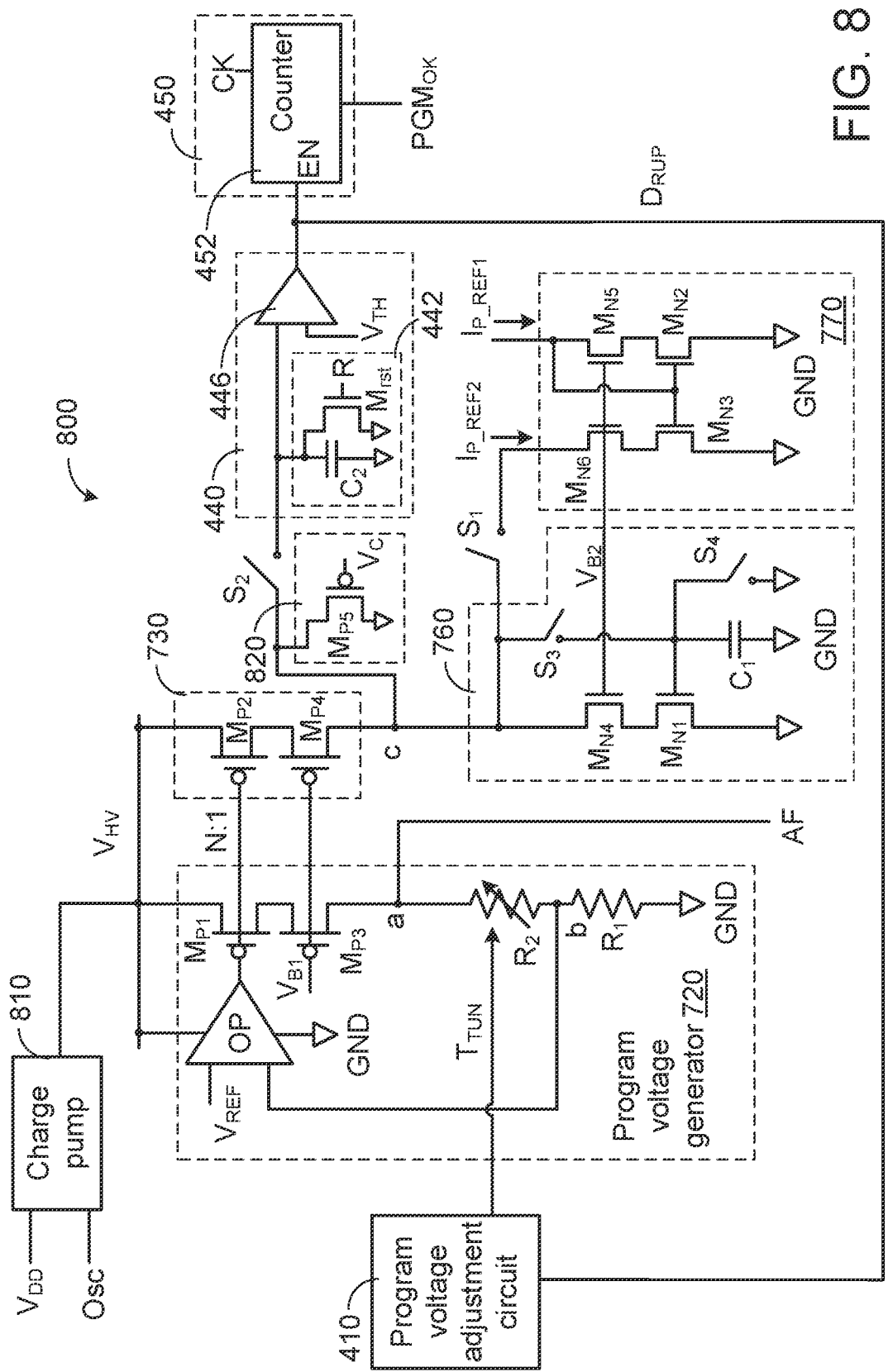
FIG. 8 is a schematic circuit diagram illustrating a program control circuit for an antifuse-type one time programming memory cell array according to a fourth embodiment of the present invention.

FIG. 8 is a schematic circuit diagram illustrating a program control circuit for an antifuse-type one time programming memory cell array according to a fourth embodiment of the present invention. In comparison with the program control circuit 700 of the third embodiment, the program control circuit 800 of this embodiment further comprises a voltage clamper 820. In addition, the supply voltage $V_{HV}$ is provided by a charge pump 810. The operating principles of the program control circuit 800 are similar to those of the program control circuit 700. Hereinafter, the circuitry structures of the charge pump 810 and the voltage clamper 820 will be described as follows.

The charge pump 810 receives a supply voltage $V_{DD}$ and an oscillation signal $O_{sc}$. According to the oscillation signal $O_{sc}$, the supply voltage $V_{DD}$ is boosted to the supply voltage $V_{HV}$ by the charge pump 810. The magnitude of the supply voltage $V_{HV}$ is higher than the magnitude of the supply voltage $V_{DD}$.

The voltage clamper 820 is connected to the node c. The voltage at the node c can be clamped to a specified voltage by the voltage clamper 820. For example, the voltage clamper 820 comprises a transistor $M_{P5}$. The source terminal of the transistor $M_{P5}$ is connected to the node c. The gate terminal of the transistor $M_{P5}$ receives a clamping voltage $V_c$. The drain terminal of the transistor $M_{P5}$ is connected to the ground terminal GND. During the normal operation, the voltage at the node c is fixed at $(V_C-V_{TH\_MP5})$, wherein $V_{TH\_MP5}$ is the threshold voltage of transistor $M_{P5}$.

During the program phases, the voltage at node c may become increasingly high due to the increase of the program current $I_P$. If the voltage at node c is too high, the switch $S_3$ may generate a leakage current to charge capacitor $C_1$, causing a change in the sample voltage $V_S$ stored in capacitor $C_1$ and resulting in a change in the calibration current $I_{MN1}$ generated by transistor $M_{N1}$. The voltage clamper 820 is capable of clamping the voltage at node c below a predetermined voltage to prevent variations of the sampling voltage $V_S$ from causing inaccuracies in the calibration current $I_{MN1}$.

Of course, the voltage clamper 820 and the charge pump 810 of the fourth embodiment can be applied to the program control circuit of the first embodiment or the program control circuit of the second embodiment.

Figure 9A:
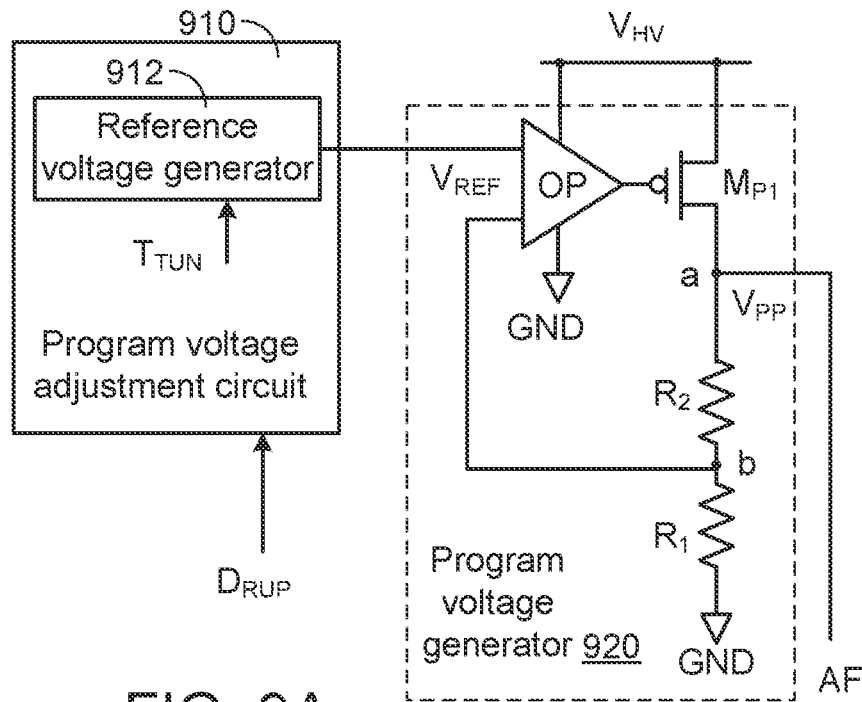
FIGS. 9A and 9B are schematic circuit diagrams illustrating other examples of the program voltage adjustment circuit and the program voltage generator in the program control circuit of the present invention.
Figure 9B:
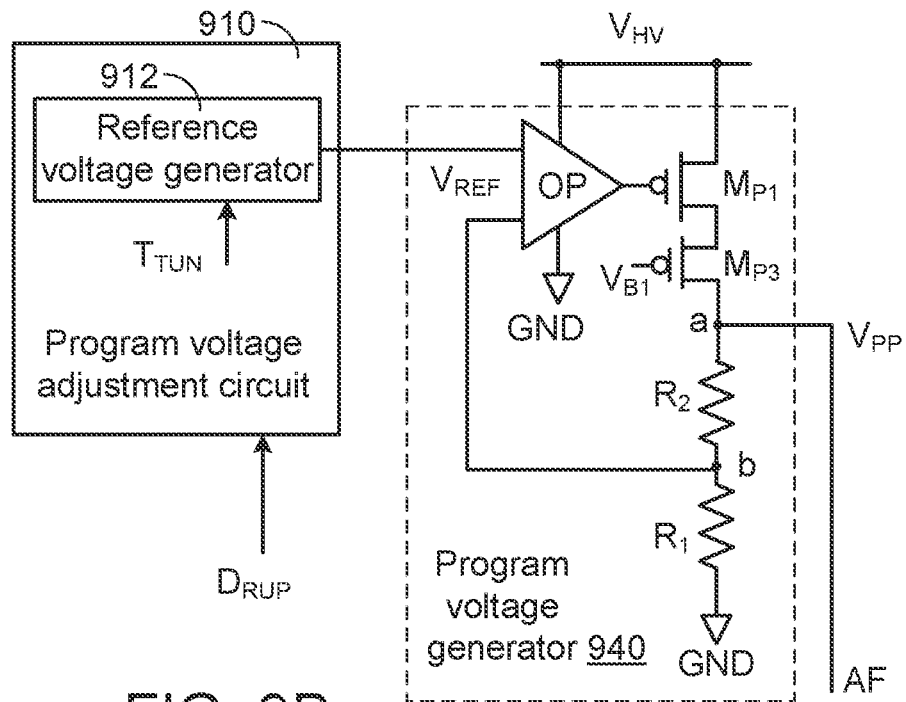

In some other embodiments, the program voltage adjustment circuit and the program voltage generator are further modified. FIGS. 9A and 9B are schematic circuit diagrams illustrating other examples of the program voltage adjustment circuit and the program voltage generator in the program control circuit of the present invention. The program voltage adjustment circuit 910 and the program voltage generator 920 as shown in FIG. 9A can be applied to the program control circuit 400 of the first embodiment or the program control circuit 490 of the second embodiment. The program voltage adjustment circuit 930 and the program voltage generator 940 as shown in FIG. 9B can be applied to the program control circuit 700 of the third embodiment or the program control circuit 800 of the fourth embodiment.

As shown in FIG. 9A, the program voltage generator 920 comprises an operational amplifier OP, a transistor $M_{P1}$, a resistor $R_1$ and a resistor $R_2$. The first input terminal of the operational amplifier OP receives a reference voltage $V_{REF}$. The source terminal of the transistor $M_{P1}$ receives a supply voltage $V_{HV}$. The gate terminal of the transistor $M_{P1}$ is connected to the output terminal of the operational amplifier OP. The drain terminal of the transistor $M_{P1}$ is connected to the node a. The two resistors $R_1$ and $R_2$ are connected between the node a and the ground terminal GND in series. Moreover, the two resistors $R_1$ and $R_2$ are connected to the node b. The node b is connected to the second input terminal of the operational amplifier OP. The resistor $R_1$ and the resistor $R_2$ have fixed resistance values.

The program voltage adjustment circuit 910 receives the rupture signal $D_{RUP}$. The program voltage adjustment circuit 910 comprises a reference voltage generator 912 to generate the reference voltage $V_{REF}$. The reference voltage generator 912 of the program voltage adjustment circuit 910 generates the reference voltage $V_{REF}$ according to an adjustment signal $T_{TUN}$.

Moreover, the relationship between the program voltage $V_{PP}$ and the reference voltage $V_{REF}$ may be expressed as: $V_{PP}=(1+R_2/R_1)\times V_{REF}$. In the program phase, if the rupture signal $D_{RUP}$ is not activated, the program voltage adjustment circuit 910 increases the reference voltage $V_{REF}$ according to the adjustment signal $T_{TUN}$. Consequently, the program voltage $V_{PP}$ is increased. When the rupture signal $D_{RUP}$ is activated, the reference voltage $V_{REF}$ is not changed by the program voltage adjustment circuit 910.

In comparison with the program voltage generator 920 of FIG. 9A, the program voltage generator 920 of FIG. 9B further comprises a load device $M_{P3}$. The source terminal of the transistor $M_{P3}$ is connected to the drain terminal of the transistor $M_{P1}$. The gate terminal of the transistor $M_{P3}$ receives the first bias voltage $V_{B1}$. The drain terminal of the transistor $M_{P3}$ is connected to the node a.

The operating principles of the program voltage generator 920 of FIG. 9A and the operating principles of the program voltage generator 920 of FIG. 9B are similar. That is, the program voltage adjustment circuit of the present invention uses the adjustment signal $T_{TUN}$ to adjust the value $R_2/R_1$ of the program voltage generator and correspondingly change the program voltage $V_{PP}$. Alternatively, the program voltage adjustment circuit of the present invention uses the adjustment signal $T_{TUN}$ to adjust the reference voltage $V_{REF}$ and correspondingly change the program voltage $V_{PP}$.

In the above embodiments, the magnitude of the program voltage $V_{PP}$ is gradually increased in different program phases. In some other embodiments, the program voltage $V_{PP}$ is increased at a ramp rate in the program phase. An example of changing the program voltage $V_{PP}$ through the adjustment of the reference voltage $V_{REF}$ will be described as follows.

Figure 9C:
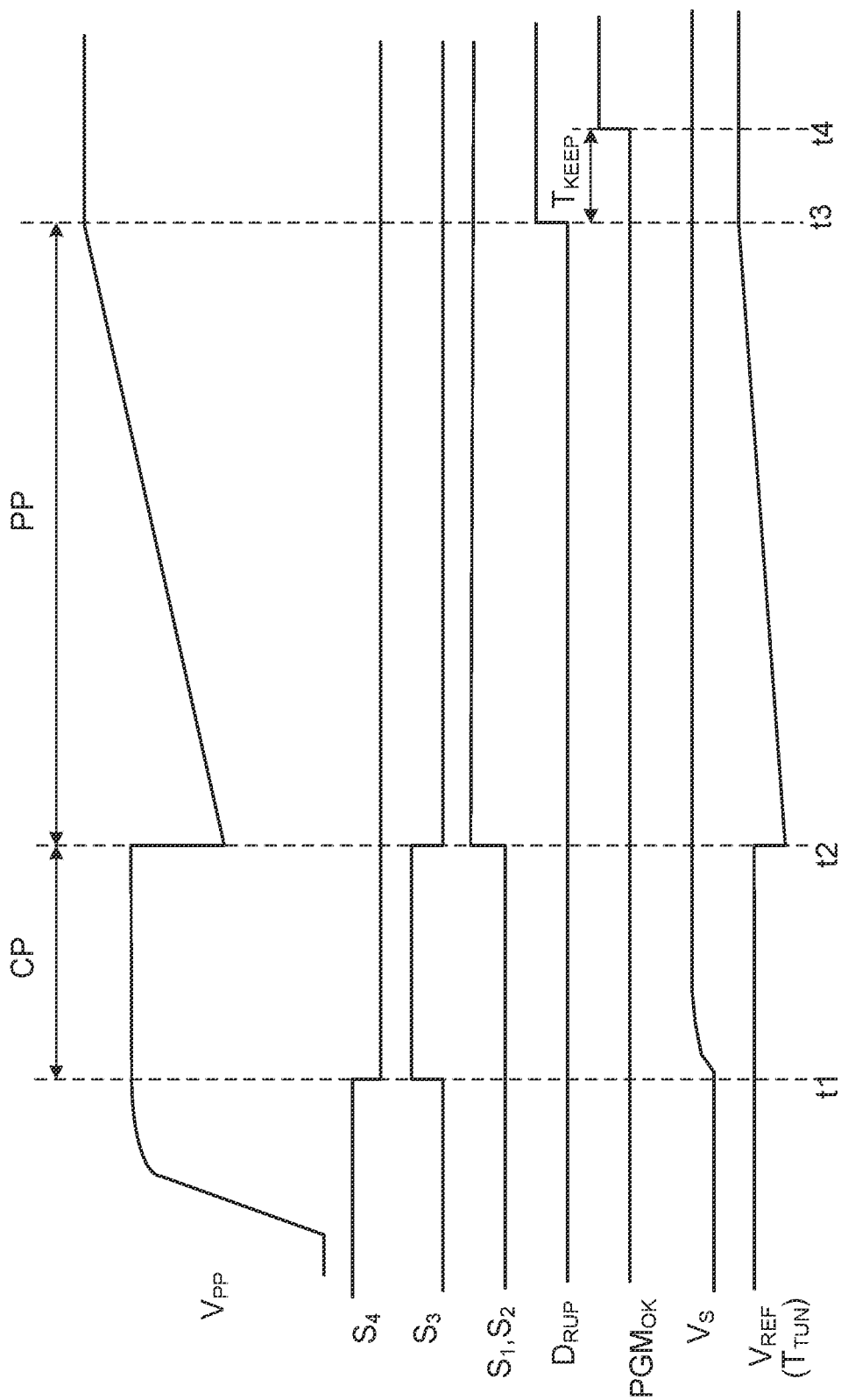
FIG. 9C is a schematic timing waveform diagram illustrating associated signals of the program control circuit in the program phase.

FIG. 9C is a schematic timing waveform diagram illustrating associated signals of the program control circuit in the program phase. The time interval between the time point t1 and the time point t3 is the program action. The time interval between the time point t1 and the time point t2 is a calibration phase CP. The time interval between the time point t2 and the time point t3 is a program phase PP. Before the program action is performed (i.e., before the time point t1), the switch $S_4$ is in the closed state, and the switches $S_1$, $S_2$ and $S_3$ are in the opened state. Consequently, the capacitor $C_1$ is reset.

In the calibration phase CP (i.e., in the time interval between the time point t1 and the time point t2), the switch $S_3$ is in the closed state, and the switches $S_1$, $S_2$ and $S_4$ are in the opened state. In the calibration phase CP, the program voltage generator provides the voltge $V_{PP}$ as a calibration voltage, based on a reference voltage $V_{REF}$ from the progam voltage reference circuit, to the antifuse control line AF. Moreover, the proportional current generator generates the calibration current. Consequently, a sampling voltage $V_S$ is stored in the capacitor $C_1$.

In the program phase PP (i.e., in the time interval between the time point t2 and the time point t3), the switches $S_3$ and $S_4$ are in the opened state, and the switches $S_1$ and $S_2$ are in the closed state. According to an adjustment signal $T_{TUN}$, the reference voltage generator 912 of the program voltage adjustment circuit 910 generates the reference voltage $V_{REF}$ at a ramp rate. Consequently, the program voltage $V_{PP}$ at a ramp rate is provided from the program voltage generator to the antifuse control line AF. At the time point t3, the rupture signal $D_{RUP}$ is activated. Since the magnitude of the program current $I_P$ is sufficient, it means that the selected memory cell is possibly programmed successfully. After the rupture signal $D_{RUP}$ has been activated for a specified time duration $T_{KEEP}$, at the time point t4, the confirmation circuit 450 generates an activated program completion signal $PGM_{OK}$ to indicate that the program action on the OTP memory cell has been completed.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A program control circuit coupled to an antifuse control line of an antifuse-type one time programming memory cell array, the program control circuit generating a program voltage to program a selected memory cell of the antifuse-type one time programming memory cell array, the program control circuit comprising:

a program voltage generator, wherein an output terminal of the program voltage generator is coupled to the antifuse control line, wherein in a calibration phase of a program action, the program voltage generator generates a calibration voltage to the antifuse control line, wherein in at least one program phase of the program action, the program voltage generator generates the program voltage to the antifuse control line;

a program voltage adjustment circuit connected to the program voltage generator, wherein the program voltage adjustment circuit receives a rupture signal, and the program voltage adjustment circuit selectively adjusts the program voltage when the rupture signal is not activated;

a proportional current generator connected to the program voltage generator, wherein in the calibration phase, the proportional current generator generates a calibration current to a first node, wherein in the at least one program phase, the proportional current generator generates an operation current to the first node;

a current sampling circuit connected to the first node, wherein in the calibration phase, the current sampling circuit converts the calibration current into a sampling voltage, wherein in the at least one program phase, the current sampling circuit generates the calibration current according to the sampling voltage, and the calibration current flows from the first node to a ground terminal;

a first switch, wherein a first terminal of the first switch is connected to the first node;

a second switch, wherein a first terminal of the second switch is connected to the first node, wherein in the calibration phase, the first switch and the second switch are in an opened state, wherein in the at least one program phase, the first switch and the second switch are in a closed state;

a current mirror, wherein a current input terminal of the current mirror receives a first reference program current, a current mirrored terminal of the current mirror generates a second reference program current, and the current mirrored terminal is connected to a second terminal of the first switch, wherein in the at least one program phase, the second reference program current flows from the first node to the current mirrored terminal of the current mirror; and a detection circuit connected to a second terminal of the second switch, wherein in the at least one program phase, the detection circuit judges a program current generated by the selected memory cell, wherein if the detection circuit judges that the program current is sufficient, the rupture signal is activated by the detection circuit.

2. The program control circuit as claimed in claim 1, wherein the program voltage generator comprises:

an operational amplifier, wherein a first input terminal of the operational amplifier receives a reference voltage;

a first transistor, wherein a source terminal of the first transistor receives a first supply voltage, a gate terminal of the first transistor is connected to an output terminal of the operational amplifier, and a drain terminal of the first transistor is connected to a second node; and a first resistor and a second resistor serially connected between the second node and the ground terminal, wherein the first resistor and the second resistor are connected to a third node, the third node is connected to a second input terminal of the operational amplifier, and the second node is coupled to the antifuse control line.

3. The program control circuit as claimed in claim 2, wherein the proportional current generator comprises a second transistor, wherein a source terminal of the second transistor receives the first supply voltage, a gate terminal of the second transistor is connected to the output terminal of the operational amplifier, and a drain terminal of the second transistor is connected to the first node.

4. The program control circuit as claimed in claim 2, wherein the program control circuit further comprises a charge pump, and the charge pump receives a second supply voltage and an oscillation signal, wherein the second supply voltage is boosted to the first supply voltage by the charge pump according to the oscillation signal.

5. The program control circuit as claimed in claim 2, wherein the program voltage adjustment circuit generates an adjustment signal to adjust a ratio of a resistance value of the second resistor to a resistance value of the first resistor in the program voltage generator, or the program voltage adjustment circuit adjusts the reference voltage according to the adjustment signal.

6. The program control circuit as claimed in claim 1, wherein the current sampling circuit comprises:
   a third transistor, wherein a drain terminal of the third transistor is connected to the first node, and a source terminal of the third transistor is connected to the ground terminal;
   a first capacitor, wherein a first terminal of the first capacitor is connected to a gate terminal of the third transistor, and a second terminal of the first capacitor is connected to the ground terminal; and
   a third switch, wherein a first terminal of third switch is connected to the first node, and a second terminal of third switch is connected to the gate terminal of third transistor, wherein the third switch is in a closed state in the calibration phase, and the third switch is in an opened state in the at least one program phase.

7. The program control circuit as claimed in claim 6, further comprises a fourth switch, a first terminal of the fourth switch is connected to the gate terminal of the third transistor, and a second terminal of the fourth switch is connected to the ground terminal, wherein the fourth switch is in the closed state before the calibration phase, and the fourth switch is in the opened state in the calibration phase and the at least one program phase.

8. The program control circuit as claimed in claim 1, wherein the current mirror comprises:
   a fourth transistor, wherein a drain terminal of the fourth transistor receives the first reference program current, the drain terminal of the fourth transistor is connected to a gate terminal of the fourth transistor, and a source terminal of the fourth transistor is connected to the ground terminal; and
   a fifth transistor, wherein a drain terminal of the fifth transistor is connected to the second terminal of the first switch, a gate terminal of the fifth transistor is connected to the gate terminal of the fourth transistor, and a source terminal of the fifth transistor is connected to the ground terminal.

9. The program control circuit as claimed in claim 1, wherein a current detecting path is formed between the first node and the detection circuit, and the detection circuit is a current comparator, wherein if a detecting current flowing through the current detecting path is higher than a threshold current, the detection circuit judges that the program current is sufficient, and the rupture signal is activated by the current comparator.

10. The program control circuit as claimed in claim 1, wherein the detection circuit comprises:
    an integration circuit comprising a second capacitor and a reset transistor, wherein a first terminal of the second capacitor is connected to the second terminal of the second switch, a second terminal of the second capacitor is connected to the ground terminal, a drain terminal of the reset transistor is connected to the second terminal of the second switch, a source terminal of the reset transistor is connected to the ground terminal, and a gate terminal of the reset transistor receives a reset signal; and
    a comparator, wherein a first terminal of the comparator is connected to the second terminal of the second switch, a second terminal of the comparator receives a threshold voltage, and an output terminal of the comparator generates the rupture signal,
    wherein a detecting current charges the second capacitor, wherein if a voltage of the second capacitor is higher than the threshold voltage, the detection circuit judges that the program current is sufficient, and the rupture signal is activated by the comparator.

11. The program control circuit as claimed in claim 1, further comprises a confirmation circuit receiving the rupture signal, wherein if the rupture signal has been activated for a specified time duration, a program completion signal is activated by the confirmation circuit.

12. The program control circuit as claimed in claim 11, wherein the confirmation circuit comprises a counter, wherein the counter receives a clock signal, and an enabling terminal of the counter receives the rupture signal, wherein when the rupture signal is activated, the counter starts to count, wherein when the counter counts to a specified number, the counter activates the program completion signal.

13. The program control circuit as claimed in claim 1, wherein the program control circuit further comprises a voltage clamper, wherein the voltage clamper is connected to the first node, and a voltage at the first node is clamped to a specified voltage by the voltage clamper.

14. The program control circuit as claimed in claim 1, wherein the program voltage generator comprises:
    an operational amplifier, wherein a first input terminal of the operational amplifier receives a reference voltage;
    a first transistor, wherein a source terminal of the first transistor receives a first supply voltage, and a gate terminal of the first transistor is connected to an output terminal of the operational amplifier;
    a second transistor, wherein a source terminal of the second transistor is connected to a drain terminal of the first transistor, a gate terminal of the second transistor receives a first bias voltage, and a drain terminal of the second transistor is connected to a second node; and
    a first resistor and a second resistor serially connected between the second node and the ground terminal, wherein the first resistor and the second resistor are connected to a third node, the third node is connected to a second input terminal of the operational amplifier, and the second node is coupled to the antifuse control line.

15. The program control circuit as claimed in claim 14, wherein the proportional current generator comprises:
    a third transistor, wherein a source terminal of the third transistor receives the first supply voltage, and a gate terminal of the third transistor is connected to the output terminal of the operational amplifier; and
    a fourth transistor, wherein a source terminal of the fourth transistor is connected to a drain terminal of the third transistor, a gate terminal of the fourth transistor receives the first bias voltage, and a drain terminal of the fourth transistor is connected to the first node.

16. The program control circuit as claimed in claim 14, wherein the program control circuit further comprises a charge pump, and the charge pump receives a second supply voltage and an oscillation signal, wherein the second supply voltage is boosted to the first supply voltage by the charge pump according to the oscillation signal.

17. The program control circuit as claimed in claim 1, wherein the current sampling circuit comprises:
    a fifth transistor, wherein a drain terminal of the fifth transistor is connected to the first node, and a gate terminal of the fifth transistor receives a second bias voltage;

a sixth transistor, wherein a drain terminal of the sixth transistor is connected to a source terminal of the fifth transistor, and a source terminal of the sixth transistor is connected to the ground terminal;

a first capacitor, wherein a first terminal of the first capacitor is connected to a gate terminal of the sixth transistor, and a second terminal of the first capacitor is connected to the ground terminal;

a third switch, wherein a first terminal of the third switch is connected to the gate terminal of the sixth transistor, and a second terminal of the third switch is connected to the ground terminal; and a fourth switch, wherein a first terminal of fourth switch is connected to the first node, and a second terminal of fourth switch is connected to the gate terminal of sixth transistor.

18. The program control circuit as claimed in claim 17, wherein the current mirror comprises:

a seventh transistor, wherein a drain terminal of the seventh transistor receives the reference program current, and a gate terminal of the seventh transistor receives the second bias voltage;

an eighth transistor, wherein a drain terminal of the eighth transistor is connected to a source terminal of the seventh transistor, a gate terminal of the eighth transistor is connected to the drain terminal of the seventh transistor, and a source terminal of the eighth transistor is connected to the ground terminal;

a ninth transistor, wherein a drain terminal of the ninth transistor is connected to the second terminal of the first switch, and a gate terminal of the ninth transistor receives the second bias voltage; and a tenth transistor, wherein a drain terminal of the tenth transistor is connected to a source terminal of the ninth transistor, a gate terminal of the tenth transistor is connected to the gate terminal of the eighth transistor, and a source terminal of the tenth transistor is connected to the ground terminal.

\* \* \* \* \*